United States Patent
Ogihara et al.

(10) Patent No.: US 8,592,956 B2
(45) Date of Patent: Nov. 26, 2013

(54) RESIST UNDERLAYER FILM COMPOSITION AND PATTERNING PROCESS USING THE SAME

(75) Inventors: Tsutomu Ogihara, Jyoetsu (JP); Daisuke Kori, Jyoetsu (JP); Yusuke Biyajima, Jyoetsu (JP); Takeru Watanabe, Jyoetsu (JP); Toshihiko Fujii, Jyoetsu (JP); Takeshi Kinsho, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/292,696

(22) Filed: Nov. 9, 2011

(65) Prior Publication Data

US 2012/0142193 A1 Jun. 7, 2012

(30) Foreign Application Priority Data

Dec. 1, 2010 (JP) .................................. 2010-268068

(51) Int. Cl.
 *H01L 23/58* (2006.01)
 *H01L 21/469* (2006.01)

(52) U.S. Cl.
 USPC .......................................... 257/643; 438/780

(58) Field of Classification Search
 USPC ............ 438/82, 623, 725, 780; 257/642–643
 See application file for complete search history.

(56) References Cited

U.S. PATENT DOCUMENTS

| | | | |
|---|---|---|---|
| 4,816,498 A | 3/1989 | Zupancic et al. | |
| 6,680,204 B1 * | 1/2004 | Turner et al. | 436/111 |

(Continued)

FOREIGN PATENT DOCUMENTS

| | | |
|---|---|---|
| JP | A-06-118651 | 4/1994 |
| JP | A-2002-334869 | 11/2002 |

(Continued)

OTHER PUBLICATIONS

Apr. 12, 2012 Extended European Search Report issued in European Application No. 11009283.0.
Abe, J. et al., "Sub-55-nm etch process using stacked-mask process," *Dry Process International Symposium*, 2005, pp. 11-12.

*Primary Examiner* — Calvin Lee
(74) *Attorney, Agent, or Firm* — Oliff & Berridge, PLC

(57) ABSTRACT

There is disclosed a resist underlayer film composition, wherein the composition contains a polymer obtained by condensation of, at least, one or more compounds represented by the following general formula (1-1) and/or general formula (1-2), and one or more kinds of compounds and/or equivalent bodies thereof represented by the following general formula (2). There can be provided an underlayer film composition, especially for a trilayer resist process, that can form an underlayer film having reduced reflectance, (namely, an underlayer film having optimum n-value and k-value), excellent filling-up properties, high pattern-antibending properties, and not causing line fall or wiggling after etching especially in a high aspect line that is thinner than 60 nm, and a patterning process using the same.

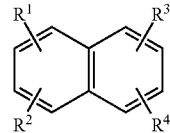

(1-1)

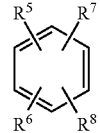

(1-2)

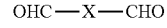

(2)

26 Claims, 2 Drawing Sheets

(56) References Cited

U.S. PATENT DOCUMENTS

| | | | |
|---|---|---|---|
| 8,173,351 B2 * | 5/2012 | Shimizu et al. | 430/270.1 |
| 8,377,627 B2 * | 2/2013 | Shimizu et al. | 430/270.1 |
| 2002/0106909 A1 | 8/2002 | Kato et al. | |
| 2004/0191479 A1 | 9/2004 | Hatakeyama et al. | |
| 2005/0255712 A1 | 11/2005 | Kato et al. | |
| 2006/0019195 A1 | 1/2006 | Hatakeyama et al. | |
| 2008/0118860 A1 | 5/2008 | Harada et al. | |
| 2009/0136869 A1 | 5/2009 | Ogihara et al. | |
| 2010/0028802 A1 | 2/2010 | Konno et al. | |
| 2010/0099044 A1 | 4/2010 | Hatakeyama et al. | |

FOREIGN PATENT DOCUMENTS

| | | |
|---|---|---|
| JP | A-2004-310019 | 11/2004 |
| JP | A-2007-199653 | 8/2007 |
| JP | A-2008-111103 | 5/2008 |
| JP | A-2009-126940 | 6/2009 |
| JP | B-4355943 | 11/2009 |
| WO | WO 2004/066377 A1 | 8/2004 |

* cited by examiner

RESIST UNDERLAYER FILM COMPOSITION AND PATTERNING PROCESS USING THE SAME

BACKGROUND OF THE INVENTION

1. Field of the Invention

The present invention relates to a resist underlayer film composition effective as an antireflective film composition used for microprocessing in manufacturing of a semiconductor device and the like, and to a resist patterning process using the resist underlayer film comosition suitable for the exposure to an ultra-violet ray, a KrF excimer laser beam (248 nm), an ArF excimer laser beam (193 nm), an $F_2$ laser beam (157 nm), a $Kr_2$ laser beam (146 nm), an $Ar_2$ laser beam (126 nm), a soft X-ray (EUV, 13.5 nm), an electron beam (EB), an X-ray, and so on.

2. Description of the Related Art

In recent years, as LSI progresses toward a higher integration and a further acceleration in speed, miniaturization of a pattern rule is being requested. Under such circumstance, in a lithography using a photo-exposure that is used nowadays as a general technology, a technology to achieve a finer and more precise pattern processing to a light source used is being developed.

Optical exposure has been widely used using g-line (436 nm) or i-line (365 nm) of a mercury-vapor lamp as a light source for lithography when a resist pattern is formed. It has been considered that a method of using an exposure light with a shorter wavelength is effective as a means for achieving a further finer pattern. For this reason, KrF excimer laser with a shorter wavelength of 248 nm has been used as an exposure light source instead of i-line (365 nm), for mass-production process of a 64 M bit DRAM processing method. However, a light source with far shorter wavelength is needed for manufacture of DRAM with a packing density of 1 G or more which needs a still finer processing technique (a processing dimension of 0.13 μm or less), and lithography using ArF excimer laser (193 nm) has been particularly examined.

In a monolayer resist method used for a typical resist patterning process, it is well known that a pattern fall due to a surface tension of a developer occurs during the time of development if a ratio of a pattern height to a pattern line width (aspect ratio) becomes larger. Accordingly, it has been known that, to form a pattern with a high aspect ratio on a non-planar substrate, a multilayer resist method in which patterning is done by laminating films having different dry etching properties has an advantage; and thus, a bilayer resist method—in which a resist layer formed of a silicon-containing photo-sensitive polymer and an underlayer formed of an organic polymer mainly comprised of elements of carbon, hydrogen, and oxygen, that is for example, a novolak polymer are combined (Japanese Patent Laid-Open (kokai) No. H6-118651 and so on)—and a trilayer resist method—in which a resist layer formed of an organic photo-sensitive polymer used in a monolayer resist method, an intermediate layer formed of a silicon-containing polymer or of a silicon-containing CVD film, and an underlayer formed of an organic polymer are combined—have been developed (Japanese Patent No. 4355943 and so on).

In the underlayer film of the foregoing multilayer resist methods, patterning is done by using the silicon-containing composition layer formed directly thereabove as a hard mask by dry etching with an oxygen gas; and thus, an organic polymer mainly comprised of elements of carbon, hydrogen, and oxygen is used, and at the same time the underlayer film is required to have an etching resistance during the time of dry etching of a substrate to be processed, a film-forming property enabling to form a highly flat film on a substrate to be processed, and, depending on a use method, an antireflective function during the time of an exposure. For example, according to Japanese Patent No. 4355943, which discloses a technology relating to an underlayer film composition for a bilayer or a trilayer resist method, by using an underlayer film such as those disclosed in the document, not only an underlayer film pattern of a high precision can be formed but also a high etching resistance to the etching condition of a substrate to be processed can be secured.

Here, FIG. 2 shows fluctuations of reflectivity of a substrate while k-value (extinction coefficient) of an intermediate resist layer is changed.

It follows from FIG. 2 that a sufficient antireflection effect to reduce reflectivity of a substrate to 1% or less can be obtained by making an intermediate resist layer to have a low k-value of 0.2 or less and a proprer thickness.

In FIG. 3 and FIG. 4, change of reflectance is shown when film thicknesses of the intermediate layer and the underlayer are changed in the cases of k-values of the underlayer film being 0.2 and 0.6. From comparison between FIG. 3 and FIG. 4, it can be seen that, in the case that k-value of the resist underlayer film is higher (in the case of 0.6 (FIG. 4)), reflectance can be reduced to 1% or lower by making the film thickness thereof thinner. In the case that k-value of the resist underlayer film is 0.2 (FIG. 3), in order to obtain reflectance of 1% in film thickness of 250 nm, film thickness of the resist intermediate film needs to be thicker. If film thickness of the resist intermediate film is increased, a load to the resist in the uppermost layer during the time of dry etching in processing of the resist intermediate film increases; and thus, this is not desirable. In FIG. 3 and FIG. 4, reflection in the case of a dry exposure with NA of an exposure equipment lens being 0.85 is shown; it can be seen that, independent of k-value in the underlayer film, reflectance of 1% or lower can be obtained by optimizing n-value (refractive index), k-value, and film thickness of the intermediate layer in the trilayer process.

However, because of an immersion lithography, NA of a projection lens is over 1.0, and angle of an incident light not only to a resist but also to an antireflective film under the resist is becoming shallower. An antireflective film suppresses the reflection not only by absorption due to the film itself but also by a negating action due to an intervention effect of a light. An intervention effect of a light is small in a slant light, and thus, reflection thereof is increased.

Among the films in the trilayer process, it is the intermediate layer that plays an antireflective role by using the intervention action of a light. The underlayer film is too thick for the intervention action so that there is no antireflective effect by a negating effect due to the intervention effect. Reflection from surface of the underlayer film needs to be suppressed; to achieve this, the k-value needs to be made less than 0.6 and the n-value near the value of the intermediate layer thereabove. If a transparency is too high due to a too small k-value, reflection from a substrate takes place; and thus, in the case of NA of an immersion exposure being 1.3, the k-value is optimum in the range between about 0.25 and about 0.48. Target n-values of both the intermediate layer and the underlayer are near the n-value of the resist, namely near 1.7.

As narrowing of a processed line width progresses, phenomena such as wiggling and bending of an underlayer film during etching of a substrate to be processed by using the underlayer film as a mask have been reported (Proc. of Symp. Dry. Process, (2005) p 11). It is generally well known that an amorphous carbon film formed by a CVD method (hereinafter CVD-C film) can very effectively prevent wiggling from occurring because amount of hydrogen atoms therein can be made extremely small.

However, in the case of a non-planar underlayment substrate to be processed, the difference in level needs to be made flat by an underlayer film. By making the underlayer film flat, variance in film thickness of an intermediate film and a photoresist formed thereabove can be suppressed so that a focus margin in lithography can be enlarged.

In the CVD-C film using a raw material such as a methane gas, an ethane gas, and an acetylene gas, it is difficult to fill up the difference in level thereof to flat. On the other hand, in the case that the underlayer film is formed by a spin coating method, there is a merit in that concavity and convexity of the substrate can be filled up.

As mentioned above, the CVD-C film is poor in filling-up of the difference in level, and in addition, introduction of a CVD equipment is sometimes difficult due to its price and occupied footprint area. If a wiggling problem could be solved by using an underlayer film composition capable of forming a film by a spin coating method, merits of simplification in process as well as in equipment thereof would be large.

Accordingly, an underlayer film composition—having optimum n-value and k-value as an antireflective film, filling-up properties, and excellent antibending properties without wiggling during etching—and a patterning process having such properties have been sought.

SUMMARY OF THE INVENTION

The present invention was made in view of the above circumstances, and has an object to provide: an underlayer film composition, especially for a trilayer resist process, that can form an underlayer film having reduced reflectance, namely, an underlayer film having optimum n-value and k-value as an antireflective film, excellent filling-up properties, high pattern-antibending properties, and not causing line fall or wiggling after etching especially in a high aspect line that is thinner than 60 nm, and a patterning process using the same.

In order to solve the foregoing problems, the present invention provides a resist underlayer film composition, wherein the composition contains a polymer obtained by condensation of, at least, one or more compounds represented by the following general formula (1-1) and/or general formula (1-2), and one or more kinds of compounds and/or equivalent bodies thereof represented by the following general formula (2):

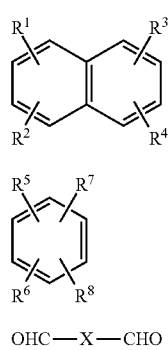

wherein $R^1$ to $R^8$ independently represent any of a hydrogen atom, a halogen atom, a hydroxyl group, an isocyanato group, a glycidyloxy group, a carboxyl group, an amino group, an alkoxyl group having 1 to 30 carbon atoms, an alkoxy carbonyl group having 1 to 30 carbon atoms, and an alkanoyloxy group having 1 to 30 carbon atoms, or an optionally-substituted saturated or unsaturated organic group having 1 to 30 carbon atoms, wherein two substituent groups arbitrarily selected from each of $R^1$ to $R^4$ or $R^5$ to $R^8$ may be bonded to form a cyclic substituent group within a molecule, and wherein X represents a single bond or a saturated or a unsaturated organic group having 1 to 30 carbon atoms.

As described above, a resist underlayer film—using a resist underlayer film composition containing a polymer obtained by condensation of, at least, one or more compounds represented by the general formula (1-1) and/or general formula (1-2), and one or more kinds of compounds and/or equivalent bodies thereof represented by the general formula (2)—functions as an excellent antireflective film especially to an exposure light of a short wavelength (i.e., the resist underlayer film is highly transparent), and has not only optimum n-value and k-value but also excellent pattern-antibending properties during the time of substrate processing.

The resist underlayer film composition can contain the polymer obtained by condensation of one or more compounds represented by the general formula (1-1) and/or general formula (1-2), one or more kinds of compounds and/or equivalent bodies thereof represented by the general formula (2), and one or more kinds of compounds and/or equivalent bodies thereof represented by the following general formula (3):

$$Y\text{—CHO} \qquad (3)$$

wherein Y represents a hydrogen atom or an optionally-substituted monovalent organic group having 1 to 30 carbon atoms.

If the resist underlayer film composition contains, as mentioned above, a polymer obtained by condensation of one or more compounds represented by the general formula (1-1) and/or general formula (1-2), one or more kinds of compounds and/or equivalent bodies thereof represented by the general formula (2), and one or more kinds of compounds and/or equivalent bodies thereof represented by the general formula (3), the resist underlayer film composition is made to have not only optimum k-value and n-value but also an excellent pattern-antibending property during substrate processing.

Further, the polymer is preferably represented by the following general formula (4-1) or (4-2):

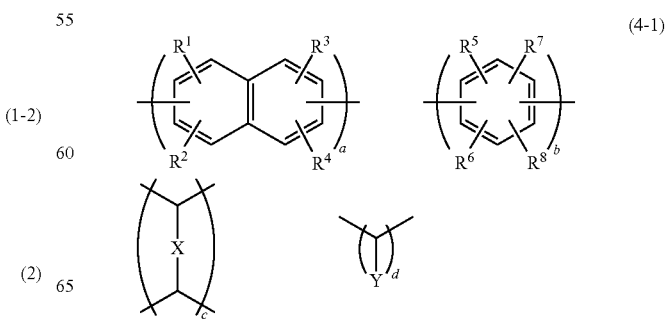

-continued (4-2)

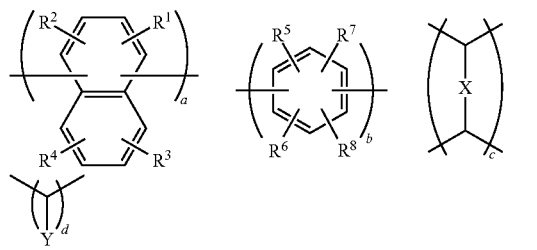

wherein R¹ to R⁸, X, and Y represent the same meanings as before, a, b, c, and d represent the ratio of each unit to the totality of repeating units with satisfying the relationships of $0<c+d<a+b<1$ and $a+b+c+d=1$.

A resist underlayer film using a resist underlayer film composition containing the polymer as mentioned above shows an excellent pattern-antibending property as an organic hard mask during the time of processing a body to be processed by dry etching.

The resist underlayer film composition can further contain any one or more of a crosslinking agent, an acid generator, and an organic solvent.

If the resist underlayer film composition contains further, as mentioned above, any one or more of an organic solvent, a crosslinking agent, and an acid generator, a crosslinking reaction in the resist underlayer film can be facilitated by baking and so on after application thereof onto a substrate and so on. Accordingly, there is no fear of intermixing between a resist underlayer film like this and a resist upper layer film, thereby reducing diffusion of a low-molecular weight component into the resist upper layer film.

The present invention provides a patterning process on a body to be processed, wherein, at least, a resist underlayer film is formed on a body to be processed by using the resist underlayer film composition of the present invention, a resist intermediate film is formed on the resist underlayer film by using a resist intermediate film composition containing a silicon atom, a resist upper layer film is formed on the resist intermediate film by using a resist upper layer film composition of a photoresist composition, a circuit pattern is formed in the resist upper layer film, the resist intermediate film is etched by using the resist upper layer film formed with the pattern as a mask, the resist underlayer film is etched by using the resist intermediate film formed with the pattern as a mask, and further, the body to be processed is etched by using the resist underlayer film formed with the pattern as a mask, whereby a pattern is formed on the body to be processed.

As mentioned above, if patterning is done by a lithography using the resist underlayer film composition of the present invention, a pattern of a high precision can be formed on a substrate.

The present invention provides a patterning process on a body to be processed, wherein, at least, a resist underlayer film is formed on a body to be processed by using the resist underlayer film composition of the present invention, a resist intermediate film is formed on the resist underlayer film by using a resist intermediate film composition containing a silicon atom, an organic antireflective film (BARC) is formed on the resist intermediate film, a resist upper layer film is formed on the BARC by using a resist upper layer film composition of a photoresist composition thereby forming a four-layer resist film, a circuit pattern is formed in the resist upper layer film, the BARC and the resist intermediate film are etched by using the resist upperlayer film formed with the pattern as a mask, the resist underlayer film is etched by using the resist intermediate film formed with the pattern as a mask, and further, the body to be processed is etched by using the resist underlayer film formed with the pattern as a mask, whereby a pattern is formed on the body to be processed.

As mentioned above, in the patterning process of the present invention, BARC can be formed between the resist intermediate film and the resist upper layer film.

The present invention provides a patterning process on a body to be processed, wherein, at least, a resist underlayer film is formed on a body to be processed by using the resist underlayer film composition of the present invention, an intermediate film of an inorganic hard mask, selected from any of a silicon oxide film, a silicon nitride film, a silicon oxide nitride film, and an amorphous silicon film, is formed on the resist underlayer film, a resist upper layer film is formed on the intermediate film of the inorganic hard mask by using a resist upper layer film composition of a photoresist composition, a circuit pattern is formed in the resist upper layer film, the intermediate film of the inorganic hard mask is etched by using the resist upperlayer film formed with the pattern as a mask, the resist underlayer film is etched by using the intermediate film of the inorganic hard mask formed with the pattern as a mask, and further, the body to be processed is etched by using the resist underlayer film formed with the pattern as a mask, whereby a pattern is formed on the body to be processed.

As mentioned above, in the patterning process of the present invention, also in the case that an intermediate film of an inorganic hard mask is used, a pattern of a high precision can be formed on a substrate when patterning is done by a lithography using the resist underlayer film composition of the present invention.

The present invention provides a patterning process on a body to be processed, wherein, at least, a resist underlayer film is formed on a body to be processed by using the resist underlayer film composition of the present invention, an intermediate film of an inorganic hard mask, selected from any of a silicon oxide film, a silicon nitride film, a silicon oxide nitride film, and an amorphous silicon film, is formed on the resist underlayer film, an organic antireflective film (BARC) is formed on the intermediate film of the inorganic hard mask, a resist upper layer film is formed on the BARC by using a resist upper layer film composition of a photoresist composition thereby forming a four-layer resist film, a circuit pattern is formed in the resist upper layer film, the BARC and the intermediate film of the inorganic hard mask are etched by using the resist upperlayer film formed with the pattern as a mask, the resist underlayer film is etched by using the intermediate film of the inorganic hard mask formed with the pattern as a mask, and further, the body to be processed is etched by using the resist underlayer film formed with the pattern as a mask, whereby a pattern is formed on the body to be processed.

If BARC is formed on an intermediate film of a hard mask as mentioned above, owing to two antireflective layers, reflection can be suppressed even in an immersion exposure with a high NA beyond 1.0. In addition, in so doing, a footing profile of a photoresist pattern on the intermediate film of a hard mask can be reduced.

In this case, the intermediate film of an inorganic hard mask can be formed by a CVD method or an ALD method.

If the intermediate film of an inorganic hard mask is formed by a CVD method or an ALD method as mentioned above, an etching resistance can be made high.

In addition, the patterning process of the resist upper layer film can be any of a photolithography method with the wavelength range between 10 nm or longer and 300 nm or shorter, a direct drawing method by an electron beam, and a nanoimprinting method, or a combination of them.

As mentioned above, patterning can be done on the resist upper layer film by any of a photolithography method with a wavelength range between 10 nm or more and 300 nm or less, a direct drawing method by an electron beam, and a nanoimprinting method, or by a combination of them.

A development method in the patterning process can be executed with an alkaline development or a development by an organic solvent.

In so doing, an alkaline development or a development by an organic solvent can be used in the present invention.

Further the body to be processed having, on a substrate of a semiconductor device, a film of any of a metal film, a metal carbide film, a metal oxide film, a metal nitride film, and a metal oxide nitride film can be used.

In this case, the metal can be any of silicon, titanium, tungsten, hafnium, zirconium, chromium, germanium, aluminum, copper, and iron, or an alloy of these metals.

As mentioned above, in the present invention, the body to be processed that is formed on a substrate of a semiconductor device with any of the following films—a metal film, a metal carbide film, a metal oxide film, a metal nitride film, and a metal oxide nitride film—may be used, wherein the metal thereof includes, for example, any of silicon, titanium, tungsten, hafnium, zirconium, chromium, germanium, copper, aluminum, and iron, or an alloy of these metals.

As mentioned above, the resist underlayer film, formed by the resist underlayer film composition of the present invention, not only functions as an excellent antireflective film especially to the exposure to a light of a short wavelength, i.e., the resist underlayer film is highly transparent and has optimum n-value and k-value, but also has excellent filling-up properties and excellent pattern-antibending properties during the time of substrate processing. In addition, if patterning is done by using the resist underlayer film composition of the present invention, a pattern of a photoresist upper layer film can be transferred and formed on a substrate to be processed with a high precision.

DETAILED DESCRIPTION OF THE PREFERRED EMBODIMENTS

Figure 1:
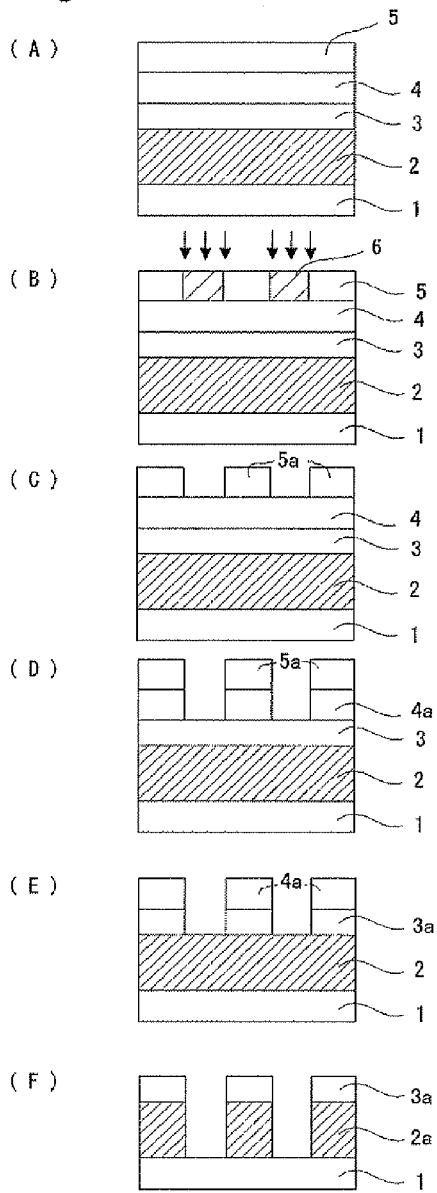
FIG. 1 is an explanatory view showing one embodiment of a patterning process (trilayer-resist process) according to the present invention.
Figure 2:
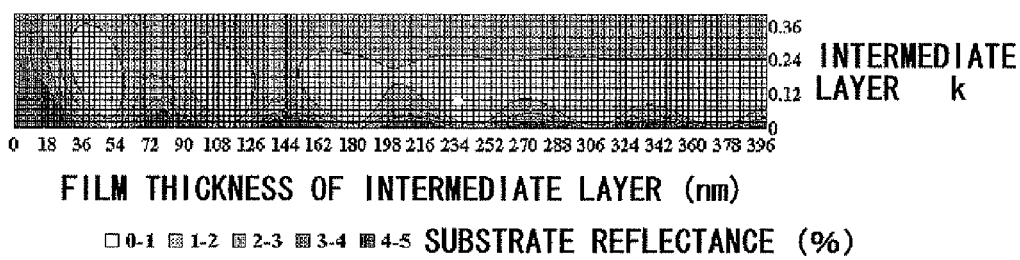
FIG. 2 is a graph showing fluctuations of reflectivity of a substrate in a trilayer-resist process where the refractive index n-value of an underlayer film is fixed at 1.5, the k-value of the underlayer film is fixed at 0.6, the thickness of the underlayer film is fixed at 500 nm, the refractive index n-value of an intermediate resist layer is fixed at 1.5, the k-value of the intermediate resist layer is changed in the range of 0 to 0.4, and the thickness of the intermediate resist layer is changed in the range of 0 to 400 nm.
Figure 3:
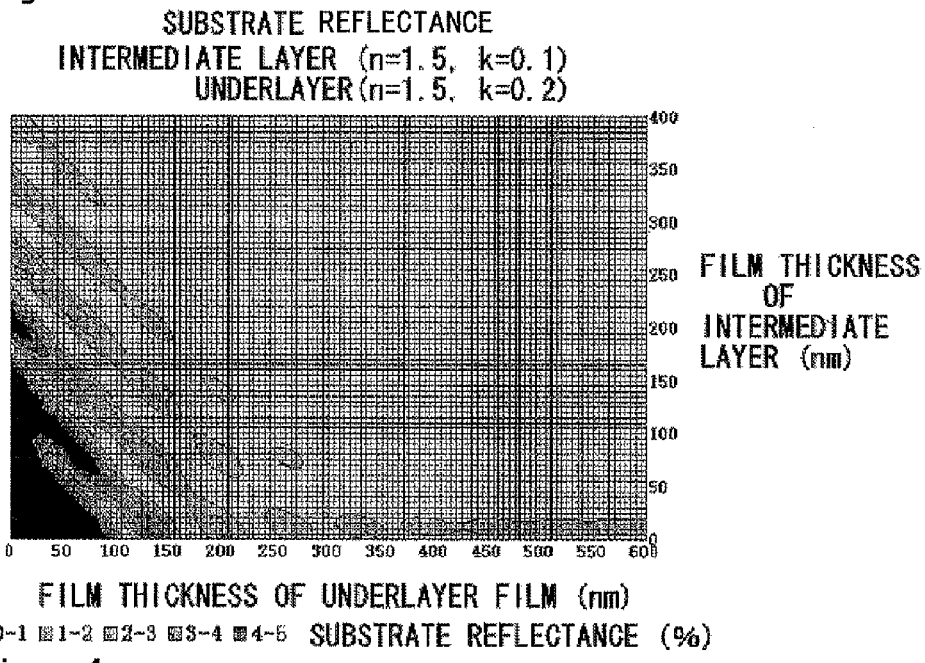
FIG. 3 is a graph showing fluctuations of reflectivity of a substrate in a trilayer-resist process where the refractive index n-value of an underlayer film is fixed at 1.5, the k-value of the underlayer film is fixed at 0.2, the refractive index n-value of an intermediate resist layer is fixed at 1.5, the k-value of the intermediate resist layer is fixed at 0.1, and the thicknesses of the underlayer film and the intermediate resist layer are changed respectively.
Figure 4:
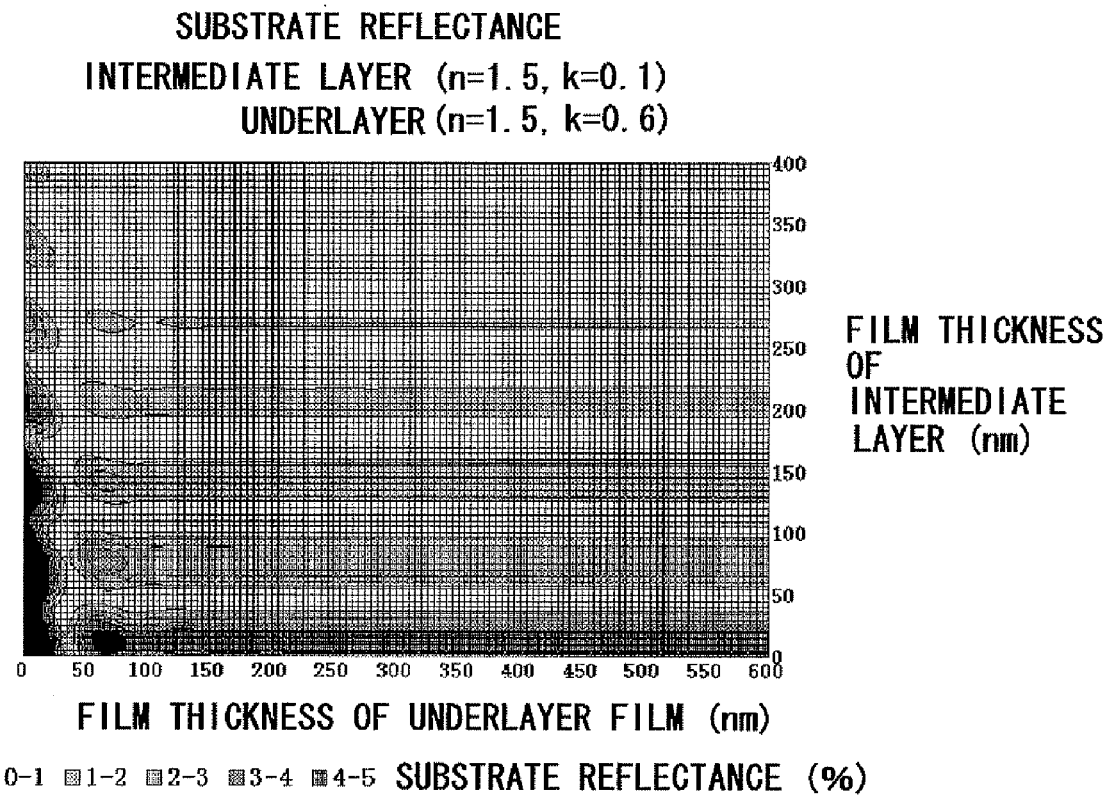
FIG. 4 is a graph showing fluctuations of reflectivity of a substrate in a trilayer-resist process where the refractive index n-value of an underlayer film is fixed at 1.5, the k-value of the underlayer film is fixed at 0.6, the refractive index n-value of an intermediate resist layer is fixed at 1.5, the k-value of the intermediate resist layer is fixed at 0.1, and the thicknesses of the underlayer film and the intermediate resist layer are changed respectively.

Hereinafter, the present invention will be explained.

As mentioned above, it is generally well known that a CVD-C film can reduce amount of hydrogen atoms contained therein to an extremely low level so that it is very effective to prevent wiggling from occurring. However, there has been a problem that the CVD-C film formed by using a raw material such as a methane gas, an ethane gas, and an acetylene gas, is poor in filling-up of a difference in level thereof to flat, and in addition, introduction of a CVD equipment is sometimes difficult due to its price and occupied footprint area.

Accordingly, an underlayer film composition—having optimum n-value and k-value as an antireflective film, filling-up properties, and excellent antibending properties without wiggling during etching—and a patterning process using the said composition have been sought.

Inventors of the present invention carried out an extensive investigation to obtain an underlayer film for a multilayer resist process, the film having a high pattern-antibending property without causing a line fall and wiggling after etching especially in a high aspect line with thinner than 60 nm; as a result, the inventors found that an underlayer film obtained from a composition containing a branched polymer as mentioned above showed a high film strength (hardness) measured by a nanoindentation method, thereby not causing a line fall and wiggling after etching, and at the same time, having not only optimum n-value and k-value as an antireflective film but also an excellent filling-up property, whereby completing the present invention.

Hereinafter, embodiments of the present invention will be explained, but the present invention is not limited by them.

The present invention is related to a resist underlayer film composition, wherein the composition contains a polymer obtained by condensation of, at least, one or more compounds represented by the following general formula (1-1) and/or general formula (1-2), and one or more kinds of compounds and/or equivalent bodies thereof represented by the following general formula (2) (hereinafter, sometimes referred to as "aldehyde compound (2)").

(Wherein $R^1$ to $R^8$ independently represent any of a hydrogen atom, a halogen atom, a hydroxyl group, an isocyanato group, a glycidyloxy group, a carboxyl group, an amino group, an alkoxyl group having 1 to 30 carbon atoms, an alkoxy carbonyl group having 1 to 30 carbon atoms, and an alkanoyloxy group having 1 to 30 carbon atoms, or an optionally-substituted saturated or unsaturated organic group having 1 to 30 carbon atoms, wherein two substituent groups arbitrarily selected from each of $R^1$ to $R^4$ or $R^5$ to $R^8$ may be bonded to form a cyclic substituent group within a molecule, and wherein X represents a single bond or a saturated or a unsaturated organic group having 1 to 30 carbon atoms.)

Herein, the term "organic group" means a group, which includes carbon, and which may additionally include hydrogen, as well as nitrogen, oxygen, sulfur, or the like (hereinafter represents the same meaning).

When a resist underlayer film composition containing a polymer like this is used, hardness of an underlayer film obtained from this composition can be made high and a pattern deformation after etching can be suppressed. In addition, optimum n-value and k-value can be obtained in photo-exposure to a light of a short wavelength such as 193 nm. In addition, an excellent filling-up property can be obtained.

Herein, examples of the naphthalene (derivative) represented by the general formula (1-1) (hereinafter sometimes referred to as "naphthalene derivative (1-1)") include naphthalene, 1-methylnaphthalene, 2-methylnaphthalene, 1,3-dimethylnaphthalene, 1,5-dimethylnaphthalene, 1,7-dimethylnaphthalene, 2,7-dimethylnaphthalene, 2-vinylnaphthalene, 2,6-divinylnaphthalene, acenaphthene, acenaphthylene, anthracene, 1-methoxynaphthalene, 2-methoxynaphthalene, 1,4-dimethoxynaphthalene, 2,7-dimethoxynaphthalene, 1-naphthol, 2-naphthol, 2-methyl-1-naphthol, 4-methoxy-1-naphthol, 7-methoxy-2-naphthol, 1,2-dihydroxynaphthalene, 1,3-dihydroxynaphthalene, 2,3-dihydroxynaphthalene, 1,4-dihydroxynaphthalene, 1,5-dihydroxynaphthalene, 1,6-dihydroxynaphthalene, 2,6-dihydroxynaphthalene, 1,7-dihydroxynaphthalene, 2,7-dihydroxynaphthalene, 1,8-dihydroxynaphthalene, 5-amino-1-naphthol, 2-methoxycarbonyl-1-naphthol, 1-(4-hydroxyphenyl)naphthalene, 6-(4-hydroxyphenyl)-2-naphthol, 6-(cyclohexyl)-2-naphthol, 1,1'-bi-2,2'-naphthol, 6,6'-bi-2,2'-naphthol, 9,9-bis(6-hydroxy-2-naphthyl)fluorene, 6-hydroxy-2-vinylnaphthalene, 1-hydroxymethylnaphthalene, 2-hydroxymethylnaphthalene, and the like.

Examples of the benzene (derivative) represented by the general formula (1-2) (hereinafter sometimes referred to as "benzene derivative (1-2)") include toluene, o-xylene, m-xylene, p-xylene, cumene, indane, indene, mesitylene, biphenyl, fluorene, phenol, anisole, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, 4-phenylphenol, tritylphenol, pyrogallol, thymol, phenylglycidylether, 4-fluorophenol, 3,4-difluorophenol, 4-trifluoromethylphenol, 4-clorophenol, 9,9-bis(4-hydroxyphenyl)fluorene, styrene, 4-t-butoxystyrene, 4-acetoxystyrene, 4-methoxystyrene, divinylbenzene, benzylalcohol, and the like.

Each of the compounds represented by the general formulae (1-1) and (1-2) may be used singly, or in a combination of two or more kinds thereof in order to control n-value, k-value, and an etching resistance.

Examples of aldehyde compound represented by the general formula (2) include the following formulae.

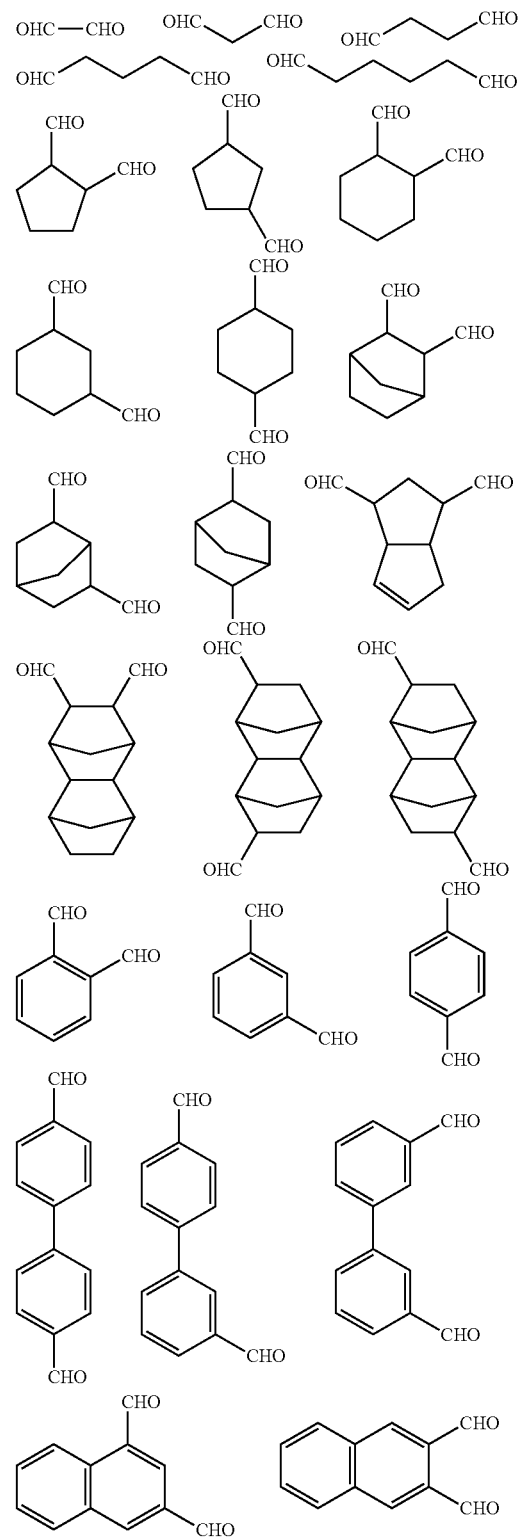

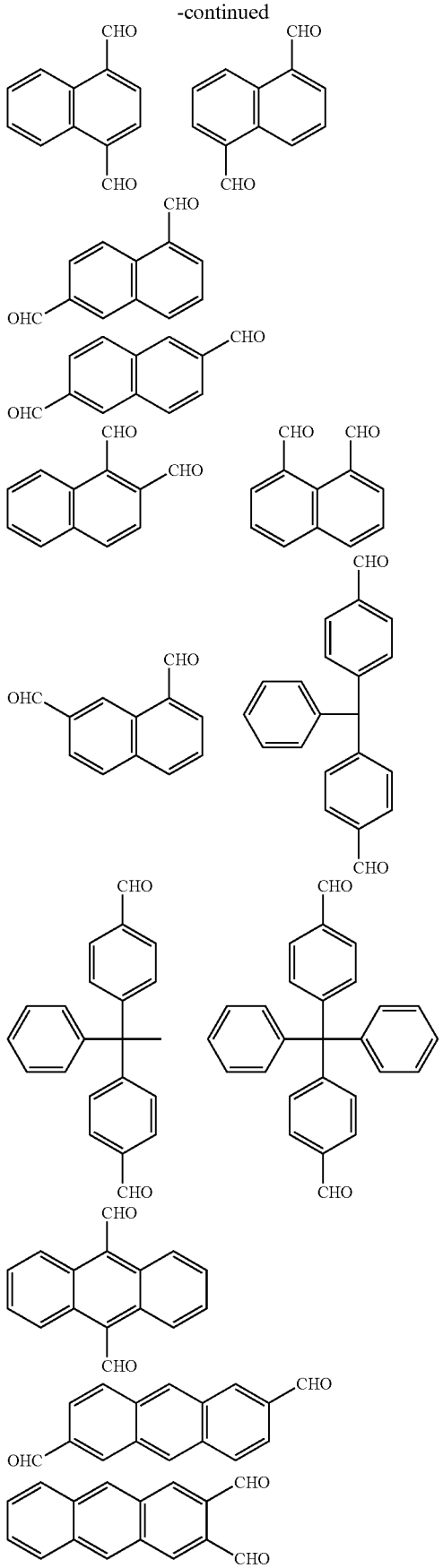

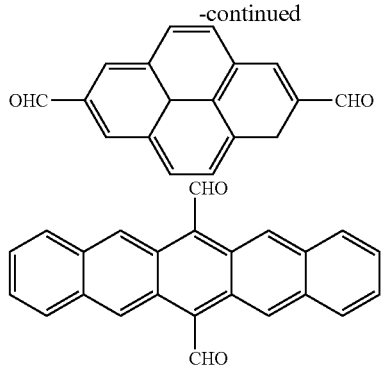

Further, an equivalent body of the aldehyde compound shown here may also be used. Examples of the equivalent body of the general formula (2) include a compound having the following general formulae.

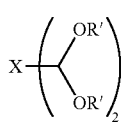
(2A)

(X is defined similarly to the foregoing X, and each R' represents an identical or a different monovalent hydrocarbon group having 1 to 10 carbon atoms.)

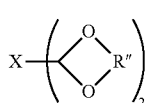
(2B)

(X is defined similarly to the foregoing X, and R" represents a divalent hydrocarbon group having 1 to 10 carbon atoms.)
<In the case that a hydrogen atom is bonded to the α-carbon atom of the formyl group.>

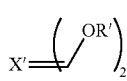
(2C)

(X' represents an organic group having one less hydrogen atom from the foregoing X, and R' represents a monovalent hydrocarbon group having 1 to 10 carbon atoms.)

Specific examples of the equivalent body of (2A) are represented by the following formulae, and similarly to the case of other aldehyde compounds, an equivalent body can be used.

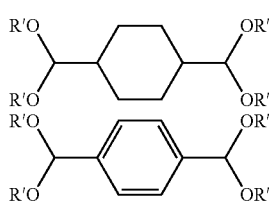

-continued

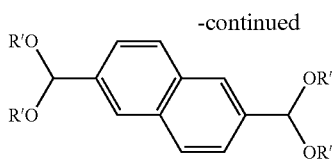

Specific examples of the equivalent body of (2B) are represented by the following formulae, and similarly to the case of other aldehyde compounds, an equivalent body can be used.

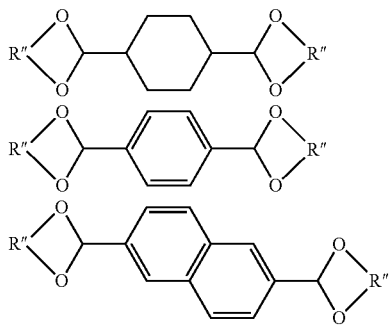

Specific examples of the equivalent body of (2C) are represented by the following formulae, and similarly to the case of other aldehyde compounds, an equivalent body can be used.

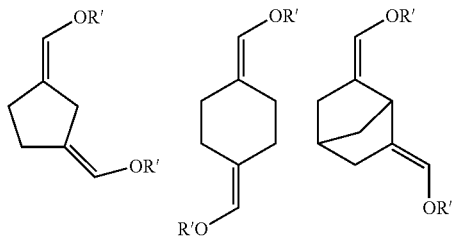

Ratio of an aldehyde compound (2) to a naphthalene derivative (1-1) and a benzene derivative (1-2) is preferably 0.01 to 5 moles, or more preferably 0.1 to 2 moles, relative to 1 mole of the totality of naphthalene derivative (1-1) and benzene derivative (1-2).

The resist underlayer film composition of the present invention may contain a polymer obtained by condensation of
one or more compounds represented by the general formula (1-1) and/or (1-2),
one or more kinds of compounds and/or equivalent bodies thereof represented by the general formula (2), and
one or more kinds of compounds and/or equivalent bodies thereof represented by the following general formula (3) (hereinafter sometimes referred to as "aldehyde compound (3)").

(Wherein Y represents a hydrogen atom or an optionally-substituted monovalent organic group having 1 to 30 carbon atoms.)

Examples of the aldehyde compound represented by the general formula (3) include formaldehyde, trioxane, paraformaldehyde, acetaldehyde, propylaldehyde, adamantanecarboaldehyde, benzaldehyde, phenylacetaldehyde, α-phenylpropylaldehyde, β-phenylpropylaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, 1-naphthylaldehyde, 2-naphthylaldehyde, anthracenecarboaldehyde, pyrenecarboaldehyde, furfural, methylal, and the like.

In addition, similarly to the case of an aldehyde compound represented by the general formula (2), an aldehyde equivalent body can be used. Specific examples of the equivalent body of the general formula (3) include a compound having the following general formulae.

(Y is defined similarly to the foregoing Y, and each R' represents an identical or a different monovalent hydrocarbon group having 1 to 10 carbon atoms.)

(Y is defined similarly to the foregoing Y, and R" represents a divalent hydrocarbon group having 1 to 10 carbon atoms.)

<In the case that a hydrogen atom is bonded to the α-carbon atom of the formyl group.>

(Y' represents an organic group having one less hydrogen atom from the foregoing Y, and R' represents a monovalent hydrocarbon group having 1 to 10 carbon atoms.)

Examples of the polymer as described above, which is contained in the resist underlayer film composition of the present invention, include a compound having the following general formula (4-1) or (4-2).

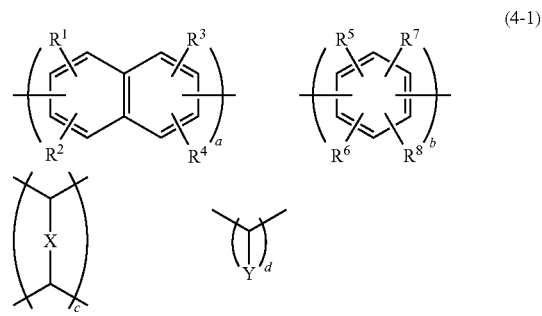

-continued

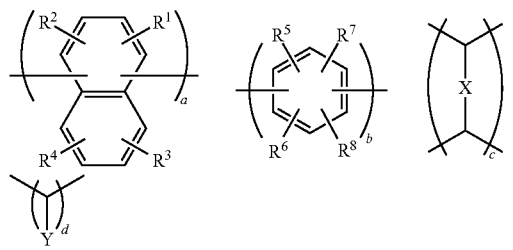

(4-2)

(Wherein $R^1$ to $R^8$, X, and Y represent the same meanings as before, and a, b, c, and d represent the ratio of each unit to the totality of repeating units with satisfying the relationships of $0<c+d<a+b<1$ and $a+b+c\alpha d=1$.)

Ratio of an aldehyde compound (2) and an aldehyde compound (3) to a naphthalene derivative (1-1) and a benzene derivative (1-2) is preferably 0.01 to 5 moles, or more preferably 0.05 to 2 moles, relative to 1 mole of the totality of (1-1) and (1-2).

Ratio to the totality of repeating units is preferably $0.1<a+b<1$, or more preferably $0.3<a+b<0.95$.

Polymers represented by the general formulae (4-1) and (4-2) (hereinafter sometimes referred to as "polymer (4-1)" and "polymer (4-2)") can be produced by a condensation reaction (for example, a condensation by dehydration) of the corresponding compounds, usually by using an acid or a base as a catalyst in a solvent or without solvent at room temperature or with cooling or heating as appropriate.

Examples of the solvent to be used include alcohols such as methanol, ethanol, isopropyl alcohol, butanol, ethylene glycol, propylene glycol, diethylene glycol, glycerol, methyl cellosolve, ethyl cellosolve, butyl cellosolve, and propylene glycol monomethyl ether; ethers such as diethyl ether, dibutyl ether, diethylene glycol diethyl ether, diethylene glycol dimethyl ether, tetrahydrofurane, and 1,4-dioxane; chlorinated solvents such as methylene chloride, chloroform, dichloroethane, and trichloroethylene; hydrocarbons such as hexane, heptane, benzene, toluene, xylene, and cumene; nitriles such as acetonitrile; ketones such as acetone, ethyl methyl ketone, and isobutyl methyl ketone; esters such as ethyl acetate, n-butyl acetate, and propylene glycol methyl ether acetate; lactones such as γ-butyrolactone; and non-protic polar solvents such as dimethyl sulfoxide, N,N-dimethyl formamide, and hexamethyl phosphoric triamide. These may be used singly or as a mixture of two or more of them. These solvents may be used in the range between 0 and 2000 parts by mass relative to 100 parts by mass of raw materials of the reaction.

Examples of the acid catalyst to be used include inorganic acids such as hydrochloric acid, hydrobromic acid, sulfuric acid, nitric acid, phosphoric acid, and heteropolyacid; organic acids such as oxalic acid, trifluoroacetic acid, methane sulfonic acid, benzene sulfonic acid, p-toluene sulfonic acid, and trifluoromethane sulfonic acid; and Lewis acids such as aluminum trichloride, aluminum ethoxide, aluminum isopropoxide, boron trifluoride, boron trichloride, boron tribromide, tin tetrachloride, tin tetrabromide, dibutyltin dichloride, dibutyltin dimethoxide, dibutyltin oxide, titanium tetrachloride, titanium tetrabromide, titanium (IV) methoxide, titanium (IV) ethoxide, titanium (IV) isopropoxide, and titanium (IV) oxide. Examples of the base catalyst to be used include an inorganic base such as sodium hydroxide, potassium hydroxide, barium hydroxide, sodium carbonate, sodium hydrogencarbonate, potassium carbonate, lithium hydride, sodium hydride, potassium hydride, and calcium hydride; an alkyl metal such as methyl lithium, n-butyl lithium, methyl magnesium chloride, and ethyl magnesium bromide; an alkoxide such as sodium methoxide, sodium ethoxide, and potassium t-butoxide; and an organic base such as triethyl amine, diisopropyl ethyl amine, N,N-dimethylaniline, pyridine, and 4-dimethylamino pyridine. The amount thereof relative to raw materials is 0.001 to 100% by mass, or preferably 0.005 to 50% by mass. Temperature of the reaction is preferably between −50° C. and about boiling point of a solvent, or more preferably between room temperature to 100° C.

As a method for carrying out the condensation reaction, there are a method in which a naphthalene derivative (1-1), a benzene derivative (1-2), aldehyde compounds (2) and (3), and a catalyst are charged all at once, a method in which a naphthalene derivative (1-1), a benzene derivative (1-2), and aldehyde compounds (2) and (3) are gradually added in the presence of a catalyst, and the like.

After the condensation reaction, in order to remove an unreacted raw material, catalyst, and so on that are present in the reaction system, a method in which temperature of the reaction vessel is increased to 130 to 230° C. at about 1 to about 50 mmHg to remove volatile components, a method in which a polymer is fractionated by adding an appropriate solvent or water, a method in which a polymer is dissolved into a good solvent then reprecipitated into a poor solvent, and so on, can be used by selecting them depending on properties of reaction products obtained.

Polystyrene-equivalent molecular weight of a polymer (4-1) or (4-2) thus obtained is preferably 500 to 500,000, or in particular 1,000 to 100,000, as the weight-average molecular weight (Mw). The molecular-weight distribution is preferably 1.2 to 20; but by cutting a monomer component, an oligomer component, or a low-molecular weight body of a molecular weight (Mw) of 1,000 or less, a volatile component during baking can be suppressed so that pollution around a baking cup and a surface defect due to drop of the volatile component may be avoided.

In addition, into the compound represented by the general formula (4-1) or (4-2) may be introduced a condensed aromatic or an alicyclic substituent group.

Specific examples of the introducible substituent group include the following.

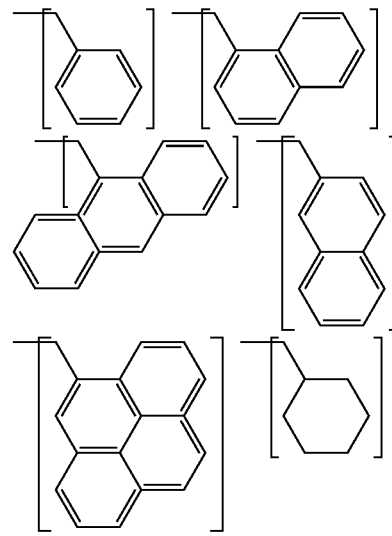

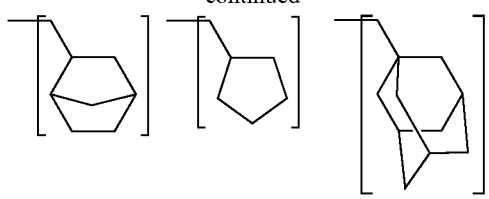
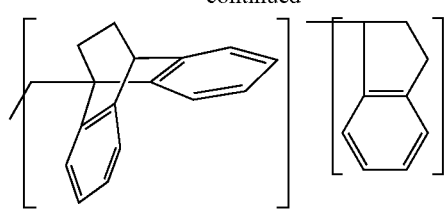
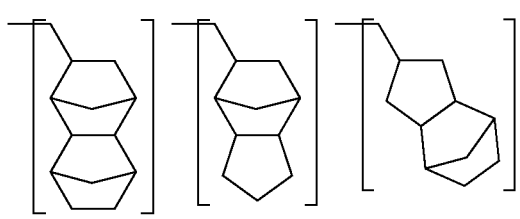
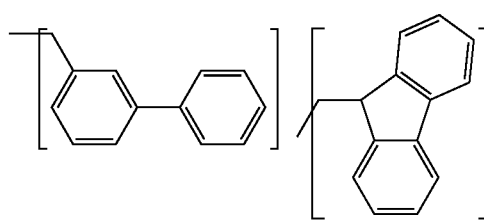
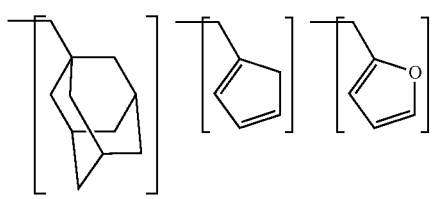
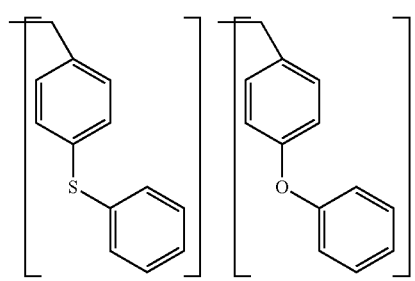
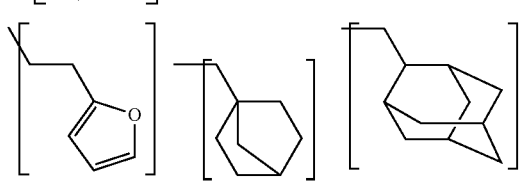
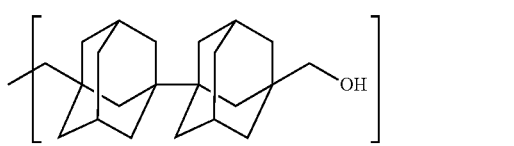
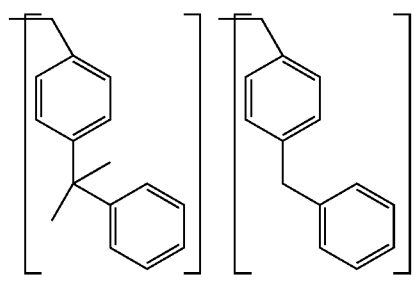
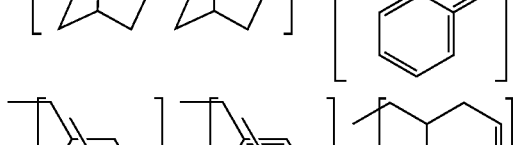
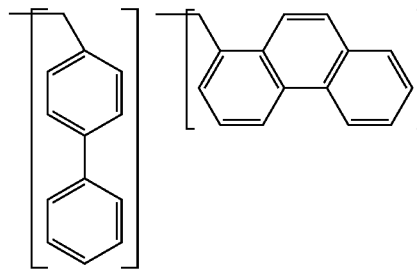
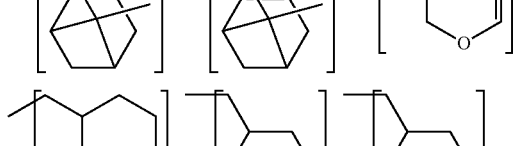
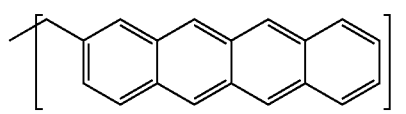
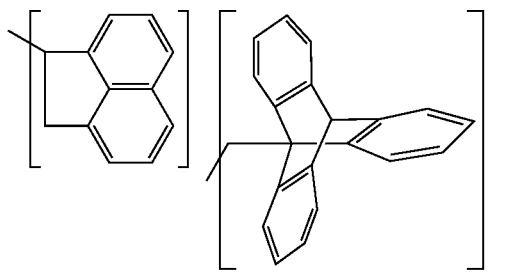
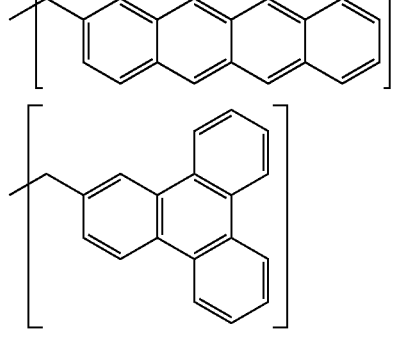

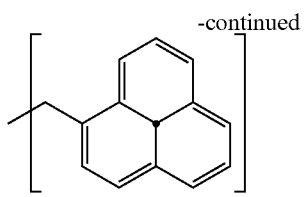

Among them, for an exposure to the light of 248 nm, a polycyclic aromatic group, such as an anthracenemethyl group and a pyrenemethyl group, is most preferably used. To increase transparency at 193 nm, a group having an alicyclic structure or a naphthalene structure is preferably used. On the other hand, a benzene ring has a window to increase transparency at 157 nm, and thus, absorbance needs to be increased by shifting an absorption wavelength. A furane ring has an absorption at a shorter wavelength than a benzene ring with the absorption at 157 nm being somewhat increased, though its effect is small. A naphthalene ring, an anthracene ring, and a pyrene ring increase the absorption due to shifting of the absorption wavelength toward a longer wavelength, and these aromatic rings have an effect to increase an etching resistance; and thus, they are preferably used.

A substituent group may be introduced by a method in which an alcohol having bonding site of a hydroxyl group in the foregoing substituent group is introduced into a polymer at an ortho-position or a para-position relative to a hydroxyl group or an alkyl group thereof in the presence of an acid catalyst in accordance with a reaction mechanism of an aromatic electrophilic substitution. Examples of the acid catalyst include hydrochloric acid, nitric acid, sulfuric acid, formic acid, oxalic acid, acetic acid, methane sulfonic acid, n-butane sulfonic acid, camphor sulfonic acid, tosyl acid, and trifluoromethane sulfonic acid. Amount of the acid catalyst is 0.001 to 20 parts by mass, relative to 100 parts by mass of a polymer before the reaction. Amount of the introduced substituent group is in the range between 0 and 0.8 mole relative to 1 mole of a monomer unit in the polymer.

In addition, blending with another polymer may be allowed. Examples of the blending polymer include a polymer, obtained from a compound represented by the general formula (1-1) or (1-2) as the raw material while having a different composition, and a heretofore known novolak resin etc. Blending a polymer like this affords a role to improve coating properties by a spin coating method and filling-up properties of a non-planar substrate. In addition, a material having a higher carbon density and a higher etching resistance can be chosen.

Examples of the heretofore known novolak resin etc. usable for blending include condensation-dehydration compounds obtained by condensation of formaldehyde and phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, isothymol, 4,4'-(9H-fluorene-9-ylidene)bisphenol, 2,2'-dimethyl-4,4'-(9H-fluorene-9-ylidene)bisphenol, 2,2'-diallyl-4,4'-(9H-fluorene-9-ylidene)bisphenol, 2,2'-difluoro-4,4'-(9H-fluorene-9-ylidene)bisphenol, 2,2'-diphenyl-4,4'-(9H-fluorene-9-ylidene)bisphenol, 2,2'-dimethoxy-4,4'-(9H-fluorene-9-ylidene)bisphenol, 2,3,2'3'-tetrahydro-(1,1')-spirobiindene-6,6'-diol, 3,3,3',3'-tetramethyl-2,3,2'3'-tetrahydro-(1,1')-spirobiindene-6,6'-diol, 3,3,3',3',4,4'-hexamethyl-2,3,2'3'-tetrahydro-(1,1')-spirobiindene-6,6'-diol, 2,3,2'3'-tetrahydro-(1,1')-spirobiindene-5,5'-diol, 5,5'-dimethyl-3,3,3',3'-tetramethyl-2,3,2'3'-tetrahydro-(1,1')-spirobiindene-6,6'-diol, 1-naphthol, 2-naphthol, 2-methyl-1-naphthol, 4-methoxy-1-naphthol, 7-methoxy-2-naphthol, dihydroxynaphthalene such as 1,5-dihydroxynaphthalene, 1,7-dihydroxynaphthalene, and 2,6-dihydroxynaphthalene, 3-hydroxy-naphthalene-2-methyl carboxylic acid, hydroxyindene, hydroxyanthracene, bisphenol, or trisphenol; polystyrene; polyvinylnaphthalene; polyvinylanthracene; polyvinylcarbazole; polyindene; polyacenaphthylene; polynorbornene; polycyclodecene; polytetracyclododecene; polynortricyclene; poly(meth)acrylate; and copolymer thereof.

Moreover, other heretofore known resins such as nortricyclene copolymer, hydrogenated-naphtholnovolak resin, naphtholdicyclopentadiene copolymer, phenoldicyclopentadiene copolymer, fluorenebilphenolnovolak resin, acenaphthylene copolymer, indene copolymer, fullerene having a phenol group, bisphenol compound and novolak resin thereof, dibisphenol compound and novolak resin thereof, novolak resin of adamantane phenol compound, hydroxyvinylnaphthalene copolymer, bisnaphthol compound and novolak resin thereof, ROMP, resin compounds such as tricyclopentadiene copolymer, and resin compounds of fullerenes can be blended.

Amount of the blending compound or amount of the blending polymer is 0 to 1,000 parts by mass, or preferably 0 to 500 parts by mass, relative to 100 parts by mass of a compound represented by the general formula (4-1) or (4-2).

The resist underlayer film composition of the present invention may contain a crosslinking agent with a purpose to facilitate a crosslinking reaction inside the resist underlayer film by baking and so on after application thereof to a substrate and so on, so that a chance of intermixing of the resist underlayer film with the resist upper layer film may be reduced thereby reducing diffusion of a low-molecular weight component to the resist upper layer film.

A crosslinking agent usable in the present invention including those materials described in paragraphs (0055) to (0060) of Japanese Patent Laid-Open Application No. 2007-199653 may be added.

In the present invention, an acid generator to further facilitate a thermal crosslinking reaction may be added. An acid generator generates an acid by thermal decomposition or by light irradiation; and any of them may be added. Specifically, those materials described in paragraphs (0061) to (0085) of Japanese Patent Laid-Open Application No. 2007-199653 may be added.

In addition, a basic compound to improve storage stability may be added into the resist underlayer film composition used in patterning process of the present invention, as will be described later. The basic compound plays a role of the quencher to an acid that is generated faintly from an acid generator, whereby a crosslinking reaction by the acid generated therefrom may be prevented from progressing.

Basic compounds specifically described in paragraphs (0086) to (0090) of Japanese Patent Laid-Open Application No. 2007-199653 may be added.

In addition, in preparation of the resist underlayer film composition of the present invention, an organic solvent may be used.

The organic solvent usable in the resist underlayer film composition to be used in the patterning process of the present invention for forming the resist underlayer film is not particularly limited, provided that the organic solvent can dissolve the base polymer, the acid generator, the crosslinking agent, and other additives, as described before. Specifically, those solvents described in paragraphs (0091) to (0092) of Japanese Patent Laid-Open Application No. 2007-199653 may be added.

Still in addition, in the underlayer film-forming composition used in patterning process of the present invention, a surfactant may be added to improve applicability in spin coating. Surfactants described in paragraphs (0165) to (0166) of Japanese Patent Laid-Open Application No. 2008-111103 may be used.

Specific example of the patterning process of the present invention using the resist underlayer film composition prepared as mentioned above includes the following.

The present invention provides a patterning process on a body to be processed, wherein, at least, a resist underlayer film is formed on a body to be processed by using the resist underlayer film composition of the present invention, a resist intermediate film is formed on the resist underlayer film by using a resist intermediate film composition containing a silicon atom, a resist upper layer film is formed on the resist intermediate film by using a resist upper layer film composition of a photoresist composition, a circuit pattern is formed in the resist upper layer film, the resist intermediate film is etched by using the resist upper layer film formed with the pattern as a mask, the resist underlayer film is etched by using the resist intermediate film formed with the pattern as a mask, and further, the body to be processed is etched by using the resist underlayer film formed with the pattern as a mask, whereby a pattern is formed on the body to be processed.

In a step of forming the resist underlayer film in the patterning process of the present invention, similarly to the photoresist, the foregoing resist underlayer film composition is applied onto a body to be processed by a spin coating method and the like. By using a spin coating method and the like, an excellent filling-up property can be obtained. After spin coating, a solvent is evaporated, and then baking is carried out to prevent mixing with the resist upper layer film and the resist intermediate film from occurring and to facilitate a crosslinking reaction. The baking is carried out in the temperature range between above 100° C. and 600° C. or lower and with the time in the range between 10 and 600 seconds, or preferably in the range between 10 and 300 seconds. The baking temperature is preferably between 150° C. or higher and 500° C. or lower, or more preferably between 180° C. or higher and 400° C. or lower. In view of effects on device damage and wafer deformation, upper limit of the heatable temperature in a lithography wafer process is 600° C. or lower, or preferably 500° C. or lower.

Atmosphere during the time of baking may be air; but it is preferable that an inert gas such as $N_2$, Ar, and He be charged to reduce oxygen so that oxidation of the resist underlayer film may be prevented from occurring. To prevent oxidation of the underlayer film from occurring, oxygen concentration needs to be controlled, preferably at 1,000 ppm or lower, or more preferably 100 ppm or lower. Prevention of oxidation of the resist underlayer film during baking from occurring is desirable because increase in absorption and decrease in etching resistance can be avoided.

Meanwhile, thickness of the resist underlayer film can be arbitrarily selected, though the range thereof is preferably 30 to 20,000 nm, or in particular 50 to 15,000 nm. In the case of the trilayer process, after forming the resist underlayer film, a resist intermediate film containing a silicon atom may be formed thereonto, followed by formation of a resist upper layer film not containing a silicon atom (monolayer resist film).

As to the resist intermediate film containing a silicon atom in the trilayer process as mentioned above, an intermediate film based on polysiloxane is used preferably. When this resist intermediate film containing a silicon atom is made to have an effect of an antireflective film, reflection can be suppressed. Specifically, a material including polysiloxanes, described in Japanese Patent Laid-Open Publication No. 2004-310019, Japanese Patent Laid-Open Publication No. 2009-126940 and so on, can be mentioned.

When a resist underlayer film using a material containing many aromatic groups and having a high etching resistance to a substrate is used, especially for exposure to the light of 193 nm wavelength, the k-value and the substrate reflectance become high; but the substrate reflectance can be reduced to 0.5% or less by suppressing reflection by the resist intermediate film.

In the case that the intermediate film of an inorganic hard mask is formed on the resist underlayer film, a silicon oxide film, a silicon nitride film, a silicon oxide nitride film (SiON film), or an amorphous silicon film is formed by a CVD method, an ALD method, or the like. A method for forming a silicon nitride film is described in Japanese Patent Laid-Open Publication No. 2002-334869, International Patent Laid-Open Publication No. 2004/066377, and so on. Thickness of the inorganic hard mask is 5 to 200 nm, or preferably 10 to 100 nm; among the foregoing films, a SiON film, which is highly effective as an antireflective film, is most preferably used. Because temperature of a substrate during the time of forming an SiON film is 300 to 500° C., the underlayer film needs to be endurable the temperature of 300 to 500° C. The resist underlayer film composition of the present invention has a high heat resistance so that it is endurable the high temperature of 300 to 500° C.; and thus, a combination of the inorganic hard mask formed by a CVD method or an ALD method with the resist underlayer film formed by a spin coating method may be possible.

A photoresist film may be formed as the resist upper layer film on the resist intermediate film or the intermediate film of an inorganic hard mask as mentioned above; but also an organic antireflective film (BARC) may be formed on the resist intermediate film or on the intermediate film of an inorganic hard mask by spin coating, followed by formation of a photoresist film thereonto.

Especially in the case that the intermediate film of an inorganic hard mask such as a SiON film is used, reflection can be suppressed even in an immersion exposure with a high NA of beyond 1.0 by virtue of a bi-layer of the SiON film and BARC. Another merit of forming BARC resides in that a footing profile of the photoresist pattern immediately above the SiON film can be suppressed.

The resist upper layer film in the trilayer resist film may be any of a positive-type and a negative-type, wherein the same composition as a generally used photoresist composition may be used. In the case that the resist upper layer film is formed by the foregoing photoresist composition, a spin coating method is preferably used, similarly to the case of forming the resist underlayer film. After spin coating of the photoresist composition, prebaking is carried out, preferably in the temperature range between 60 and 180° C. for time between 10 and 300 seconds. Thereafter, exposure, post-exposure bake (PEB), and development are carried out according to respective conventional methods to obtain a resist pattern. Meanwhile, thickness of the resist upper layer film is not particularly limited, though the thickness between 30 and 500 nm, in particular between 50 and 400 nm, is preferable.

As to the foregoing patterning process of the resist upper layer film, patterning may be done by a method such as a photolithography method with the wavelength range between 10 nm or longer and 300 nm or shorter, a direct drawing method by an electron beam, and a nanoimprinting method, or a combination of them.

Specific examples of the development method in the patterning process as mentioned above include an alkaline development and a development by an organic solvent.

Then, etching is carried out by using the obtained resist pattern as a mask. Etching of the resist intermediate film in the trilayer process, especially etching of the inorganic hard mask is carried out by using a fluorocarbon gas and using a resist pattern as a mask. Then, etching of the resist underlayer film is carried out by using an oxygen gas or a hydrogen gas and a resist intermediate film pattern, especially an inorganic hard mask pattern, as a mask.

Subsequent etching of the body to be processed may be carried out also by a conventional method; for example, etching is carried out by using a gas mainly comprised of a fluorocarbon gas in the case of the substrate being $SiO_2$, SiN, or a silica-type low-dielectric insulating film, while, in the case of p-Si, Al, or W, etching is carried out by a gas mainly comprised of a chlorine-type gas or a bromine-type gas. In the case that processing of the substrate is carried out by etching with a fluorocarbon gas, the intermediate layer containing a silicon atom in the trilayer process is removed at the same time as processing of the substrate. In the case that etching of the substrate is carried out by a chlorine-type gas or a bromine-type gas, removal of the intermediate layer containing a silicon atom needs to be carried out separately by dry etching with a fluorocarbon gas after processing of the substrate.

The resist underlayer film formed by the patterning process of the present invention for forming the resist underlayer film has a characteristic of excellent etching resistance to these bodies to be processed.

Meanwhile, as to the body to be processed, the one such as those having, on a substrate of a semiconductor device (substrate), any of the following metal films (hereinafter, "layer to be processed")—a metal film, a metal carbide film, a metal oxide film, a metal nitride film, and a metal oxide nitride film—may be used.

The substrate is not limited and may be Si, an amorphous silicon ($\alpha$-Si), p-Si, $SiO_2$, SiN, SiON, W, TiN, Al, or the like. The substrate may be a material different from the layer to be processed may be used.

The layer to be processed may be made of Si, $SiO_2$, SiON, SiN, p-Si, $\alpha$-Si, W, W—Si, Al, Cu, Al—Si, or the like; various low dielectric constant films, or etching stopper films. Typically, the layer may be formed at a thickness of 50 to 10,000 nm, in particular at a thickness of 100 to 5,000 nm.

One embodiment of the patterning process of the present invention (trilayer process) will be specifically shown as following with referring to FIG. 1.

In the case of the trilayer process, as shown in FIG. 1 (A), after the resist underlayer film 3 is formed by the present invention on the film to be processed 2 that is laminated on the substrate 1, the resist intermediate film 4 is formed, and then, the resist upper layer film 5 is formed thereonto.

Then, as shown in FIG. 1 (B), the intended part 6 of the resist upper layer film is exposed, which is then followed by PEB and development to form the resist pattern 5a (FIG. 1 (C)). By using the resist pattern 5a thus obtained as a mask, the resist intermediate film 4 is processed by etching with a fluorocarbon gas to form the resist intermediate film pattern 4a (FIG. 1 (D)). After removal of the resist pattern 5a, by using the resist intermediate film pattern 4a thus obtained as a mask, the resist underlayer film 3 is etched by an oxygen plasma method to form the resist underlayer film pattern 3a (FIG. 1 (E)). Further, after removal of the resist intermediate film pattern 4a, the film to be processed 2 is processed by etching using the resist underlayer film pattern 3a as a mask to form the pattern 2a on the substrate (FIG. 1 (F)).

Meanwhile, in the case that the intermediate film of an inorganic hard mask is used, the resist intermediate film 4 shows the intermediate film of an inorganic hard mask, and the resist intermediate film pattern 4a is the intermediate film pattern of an inorganic hard mask 4a.

In the case that BARC is formed, BARC is formed between the resist intermediate film (or intermediate film of an inorganic hard mask) 4 and the resist upper layer film 5. Etching of BARC may be carried out continuously in advance of etching of the resist intermediate film (or intermediate film of an inorganic hard mask) 4, or etching of the resist intermediate film (or intermediate film of an inorganic hard mask) 4 may be carried out by changing an equipment and the like after only BARC is etched.

EXAMPLES

Hereafter the present invention will be explained in detail with reference to Synthesis Examples, Comparative Synthesis Examples, Examples and Comparative Examples. However, the present invention is not limited thereto.

In addition, as for measurement of molecular weight, weight average molecular weight (Mw) and number average molecular weight (Mn) relative to polystyrene standards were determined by gel permeation chromatography (GPC), and molecular-weight distribution (Mw/Mn) was determined.

Synthesis Example 1

Into a 500-mL flask was taken 80 g of 1,5-dihydroxynaphtharene (0.5 mole), 20 g of terephthaldicarboaldehyde (0.15 mole), and 290 g of methoxypropanol; and then, into the resulting mixture was added 20 g of a methoxypropanol solution of 20% p-toluenesulfonic acid with stirring at 65° C. After stirring was continued at the same temperature for 2 hours, the content therein was cooled to room temperature, transferred to a separation funnel containing 800 mL of ethyl acetate, and washed with 500 mL of deionized water; and then washing water was discarded. This washing and separation procedures were repeated, whereby the reaction catalyst and metal impurities were removed. After the obtained solution was concentrated under reduced pressure, 500 mL of THF was added to the residue, and then a polymer was reprecipitated by 4,000 mL of hexane. The precipitated polymer was collected by filtration and then dried under reduced pressure to obtain Polymer 1.

(Mw/Mn) of Polymer 1 were obtained by gel permeation chromatography (GPC). In addition, a mole ratio of dihydroxynaphtharene (a) and terephtaldicarboaldehyde (b) in Polymer 1 was obtained by $^1$H-NMR. The results are shown below.

Mole ratio a:b=0.77:0.23
Weight-average molecular weight (Mw)=47,000
Molecular-weight distribution (Mw/Mn)=11.5

Synthesis Examples 2 to 12 and Comparative Synthesis Examples 1 to 3

Polymers 2 to 15 shown in Table 2 were obtained by using the materials shown in Table 1 under the same condition as Synthesis Example 1.

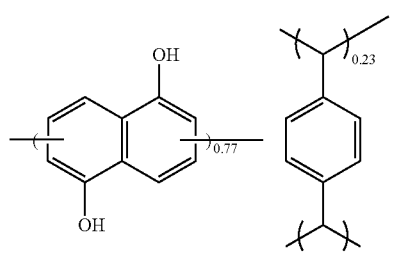

Polymer 1

The weight-average molecular weight (Mw) (relative to polystyrene standard) and the molecular-weight distribution

TABLE 1

| Synthesis Example | Compond (1-1) and/or (1-2) | Reaction solvent | Reaction catalyst | Compound (2) | Compound (3) |
|---|---|---|---|---|---|
| 1 | 1,5-dihydroxynaphthalene 80 g | methoxypropanol 290 g | B 5 g | OHC—C₆H₄—CHO 20 g | — |
| 2 | 1,5-dihydroxynaphthalene 80 g | methoxypropanol 290 g | B 5 g | OHC—C₆H₄—CHO 6.7 g | paraformaldehyde 6.0 g |
| 3 | 1,5-dihydroxynaphthalene 80 g | methoxypropanol 290 g | B 5 g | OHC—C₆H₄—CHO 3.4 g | paraformaldehyde 7.5 g |
| 4 | 1,5-dihydroxynaphthalene 72 g | methoxypropanol 290 g | B 5 g | OHC—C₆H₁₀—CHO 3.5 g | paraformaldehyde 7.5 g |
| 5 | 2,8-dihydroxynaphthalene 80 g | methoxypropanol 290 g | B 5 g | OHC—C₆H₄—CHO 6.7 g | paraformaldehyde 5.3 g |

TABLE 1-continued
| Synthesis Example | Compound (1-1) and/or (1-2) | Reaction solvent | Reaction catalyst | Compound (2) | Compound (3) |
|---|---|---|---|---|---|
| 6 | 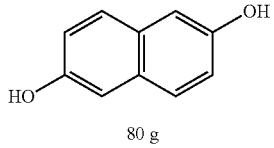 80 g | methyl cellosolve 200 g | A 5 g | 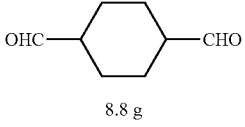 8.8 g | — |
| 7 | 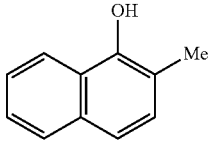 79 g | methyl cellosolve 200 g | A 5 g | 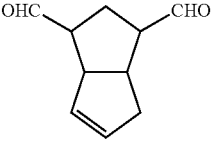 8.2 g | paraformaldehyde 3.0 g |
| 8 | 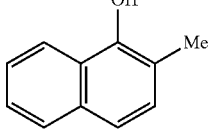 79 g | methyl cellosolve 200 g | A 5 g | 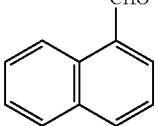 9.2 g | 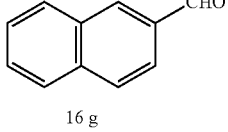 16 g |
| 9 | 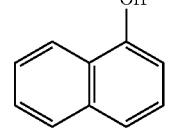 58 g 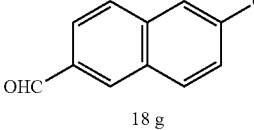 11 g | methyl cellosolve 200 g | A 5 g | 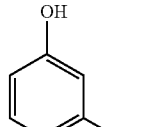 18 g | — |
| 10 | 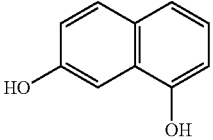 56 g 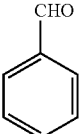 16 g | methyl cellosolve 200 g | A 5 g | 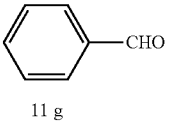 21 g | 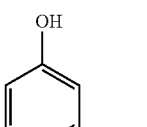 11 g |

TABLE 1-continued

| Synthesis Example | Compound (1-1) and/or (1-2) | Reaction solvent | Reaction catalyst | Compound (2) | Compound (3) |
|---|---|---|---|---|---|
| 11 | 3-methylphenol (m-cresol) 54 g | methyl cellosolve 200 g | A 5 g | 1,4-cyclohexanedicarbaldehyde (OHC—C$_6$H$_{10}$—CHO) 14 g | — |
| 12 | 3-methylphenol (m-cresol) 54 g | methyl cellosolve 200 g | A 5 g | naphthalene-1,4-dicarbaldehyde 18 g | norbornane-2-carbaldehyde 19 g |

(Comparative Synthesis Example)

| | | | | | |
|---|---|---|---|---|---|
| 1 | naphthalene-1,5-diol 80 g | methoxypropanol 290 g | B 5 g | — | paraformaldehyde 9.0 g |
| 2 | naphthalene-1,5-diol 80 g | methoxypropanol 290 g | B 5 g | — | paraformaldehyde 6.0 g; benzaldehyde 11 g |
| 3 | naphthalene-1,5-diol 80 g | methoxypropanol 290 g | B 5 g | — | benzaldehyde 32 g |

Reaction catalyst A: a methyl cellosolve solution of 20% p-toluenesulfonic acid

Reaction catalyst B: a methoxy propanol solution of 20% p-toluenesulfonic acid

TABLE 2
| Synthesis Example | Product (mole ratio) | Weight-average molecular weight (Mw) | Molecular-weight distribution (Mw/Mn) |
|---|---|---|---|
| 1 | Polymer 1 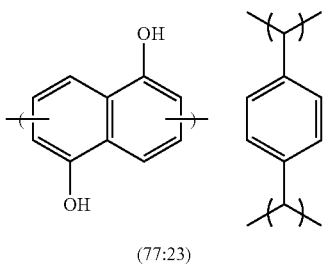 (77:23) | 47,000 | 11.5 |
| 2 | Polymer 2 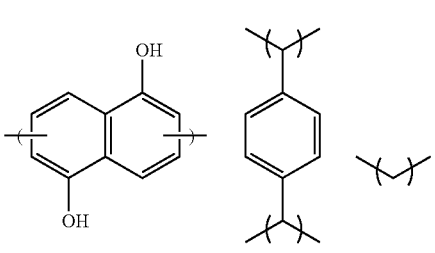 (65:7:28) | 12,200 | 11.2 |
| 3 | Polymer 3 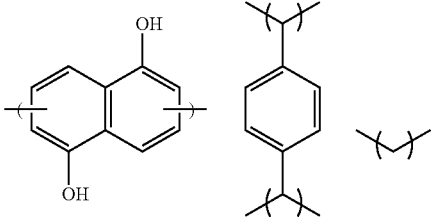 (64:3:33) | 8,700 | 10.8 |
| 4 | Polymer 4 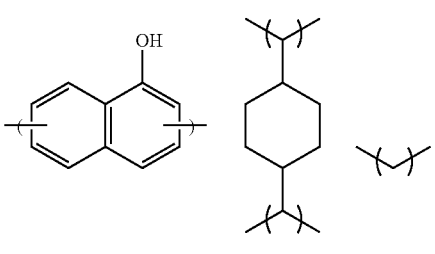 (64:3:33) | 7,900 | 10.3 |
| 5 | Polymer 5 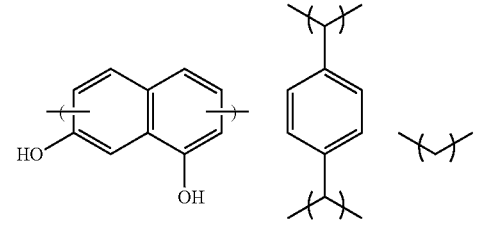 (68:7:25) | 10,100 | 9.8 |

TABLE 2-continued
| Synthesis Example | Product (mole ratio) | Weight-average molecular weight (Mw) | Molecular-weight distribution (Mw/Mn) |
|---|---|---|---|
| 6 | Polymer 6 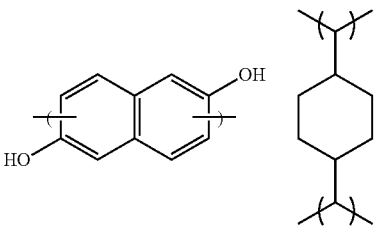 (87:13) | 18,500 | 8.9 |
| 7 | Polymer 7 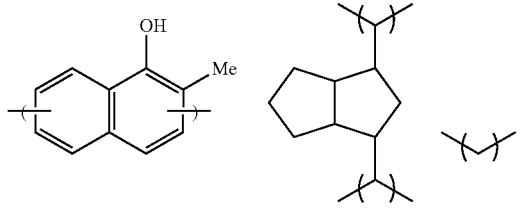 (75:8:17) | 9,800 | 9.9 |
| 8 | Polymer 8 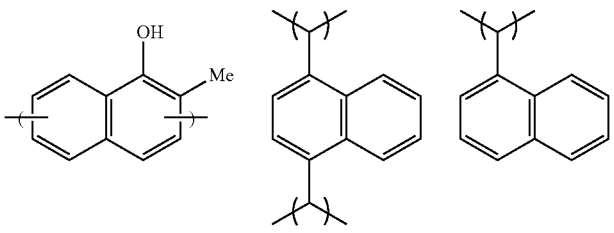 (76:8:16) | 13,800 | 10.5 |
| 9 | Polymer 9 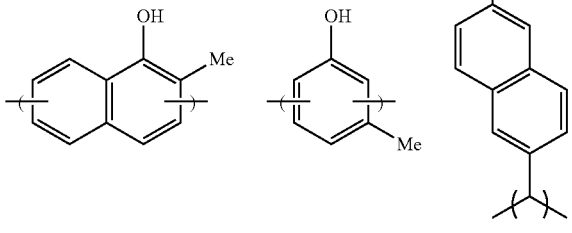 (64:18:18) | 13,800 | 7.9 |
| 10 | Polymer 10 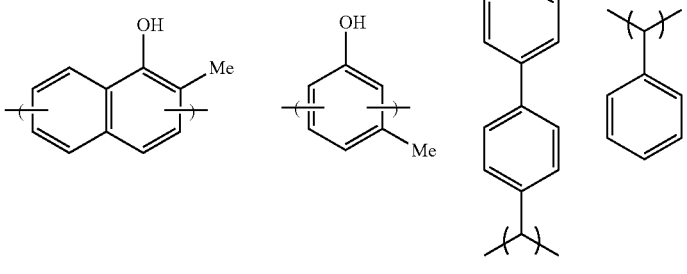 (51:22:12:15) | 7,300 | 7.2 |

TABLE 2-continued

| Synthesis Example | Product (mole ratio) | Weight-average molecular weight (Mw) | Molecular-weight distribution (Mw/Mn) |
|---|---|---|---|
| 11 Polymer 11 | 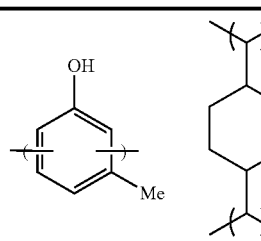<br>(83:17) | 8,900 | 7.4 |
| 12 Polymer 12 | 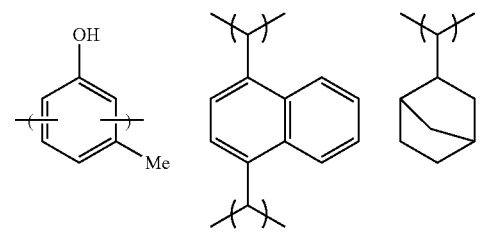<br>(70:7:23)<br>(Comparative Synthesis Example) | 9,400 | 8.6 |
| 1 Polymer 13 | 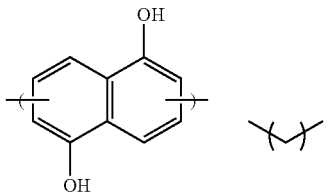<br>(62:38) | 1,500 | 2.2 |
| 2 Polymer 14 | 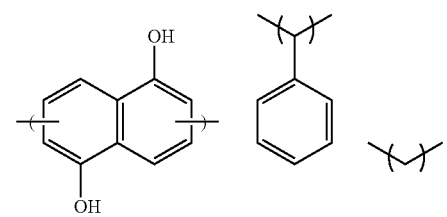<br>(61:12:27) | 2,600 | 4.9 |
| 3 Polymer 15 | 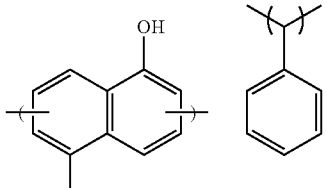<br>(63:37) | 1,500 | 2.4 |

Examples and Comparative Examples

Preparation of Resist Underlayer Film Composition

Each solution for forming a resist underlayer film (SOL-1 to SOL-15) was prepared by dissolving 20 parts by mass of any of the polymer 1 to 15 obtained in the above Synthesis Examples, 1 part by mass of an acid generator shown by the following AG1, and 4 parts by mass of a closslinking agent shown by the following CR1, in 100 parts by mass of a propylene glycol monomethyl ether acetate solution containing 0.1% by mass of FC-430 (produced by Sumitomo 3M Ltd.), and filtrating the solution through a 0.1 μm filter made from the fluorine resin.

AG1

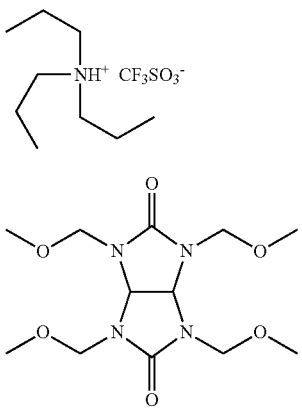

CR1

This solution was applied (by spin coating) onto a silicon substrate, and then baked at 250° C. for 60 seconds to obtain each of coated films UDL-1 to UDL-15 having film thickness of 200 nm. Refractive indexes (n and k) of these films at the wavelength of 193 nm were measured with a spectroscopic ellipsometer with a variable incident light angle (VASE, manufactured by J. A. Woollam Co., Inc.). The results thereof are shown in Table 3. Further, by a nanoindentation test, hardness of each foregoing coated film was measured with a SA-2 nanoindenter instrument (manufactured by Toyo Corporation). The results thereof are also shown in Table 3.

TABLE 3

| | Solution for forming underlayer film | Under- layer film | Raw material polymer | Optical property(193 nm) | | Hard- ness (GPa) |
|---|---|---|---|---|---|---|
| | | | | n- value | k- value | |
| Example | SOL-1 | UDL-1 | polymer 1 | 1.48 | 0.55 | 0.65 |
| | SOL-2 | UDL-2 | polymer 2 | 1.45 | 0.47 | 0.65 |
| | SOL-3 | UDL-3 | polymer 3 | 1.43 | 0.41 | 0.60 |
| | SOL-4 | UDL-4 | polymer 4 | 1.44 | 0.39 | 0.65 |
| | SOL-5 | UDL-5 | polymer 5 | 1.45 | 0.47 | 0.50 |
| | SOL-6 | UDL-6 | polymer 6 | 1.48 | 0.35 | 0.60 |
| | SOL-7 | UDL-7 | polymer 7 | 1.46 | 0.36 | 0.55 |
| | SOL-8 | UDL-8 | polymer 8 | 1.40 | 0.26 | 0.50 |
| | SOL-9 | UDL-9 | polymer 9 | 1.43 | 0.50 | 0.60 |
| | SOL-10 | UDL-10 | polymer 10 | 1.50 | 0.57 | 0.60 |
| | SOL-11 | UDL-11 | polymer 11 | 1.53 | 0.35 | 0.60 |
| | SOL-12 | UDL-12 | polymer 12 | 1.55 | 0.33 | 0.55 |
| Comparative Example | SOL-13 | UDL-13 | polymer 13 | 1.40 | 0.32 | 0.40 |
| | SOL-14 | UDL-14 | polymer 14 | 1.45 | 0.41 | 0.40 |
| | SOL-15 | UDL-15 | polymer 15 | 1.51 | 0.50 | 0.40 |

As shown in Table 3, the resist underlayer films of UDL-1 to UDL-15 have n-values of refractive index in the range of 1.4 to 1.6, and k-values of refractive index in the range of 0.25 to 0.60. Thus the resist underlayer films have sufficient antireflection effects as underlayer films for trilayer resist. The resist underlayer films have optimum refractive indexes (n-values) and optimum extinction coefficients (k-values) that provide sufficient antireflection effects in particular when the resist underlayer films have thicknesses of 200 nm or more.

In addition, the resist underlayer films formed by spin-coating have an excellent filling-up property.

In polymers of Comparative Examples not containing an aldehyde compound represented by the formula (2), the hardness was less than 0.50 GPa. From this, it can be seen that those polymers containing an aldehyde compound represented by the formula (2) have a higher hardness and a more dense structure than those polymers not containing the aldehyde compound.

In addition, it can be seen that the k-value and the hardness can be controlled by presence or not presence of an aldehyde compound represented by the general formula (3).

Examples 1 to 12 and Comparative Examples 1 to 3

Pattern Etching Tests

Each of the resist underlayer film compositions (UDL-1 to UDL-15) was applied (spin-coated) onto a Si wafer substrate (diameter of 300 mm) formed with a SiO$_2$ film having film thickness of 200 nm, and then baked at 250° C. for 60 seconds to obtain a resist underlayer film having film thickness of 200 nm (Examples 1 to 12 and Comparative Examples 1 to 3). A resist intermediate film composition containing a silicon atom (SOG-1) that was prepared by a conventional method was applied, and then baked at 220° C. for 60 seconds to form a resist intermediate film having film thickness of 35 nm; then a resist upper layer film composition (SL resist solution for ArF) was applied, and then baked at 105° C. for 60 seconds to form a resist upper layer film having film thickness of 100 nm. An immersion-top coat (TC-1) was applied onto the resist upper layer film thus obtained, and then baked at 90° C. for 60 seconds to form a top coat having film thickness of 50 nm. Meanwhile, the resist upper layer film composition was prepared by dissolving a resin, an acid generator, and a basic compound, with the components and ratio thereof as shown in Table 4, into a solvent containing 0.1% by mass of FC-430 (manufactured by Sumitomo 3M Limited), followed by filtering the thus obtained solution through a 0.1-μm filter made of a fluorinated resin.

TABLE 4

| No. | Polymer (parts by mass) | Acid generator (parts by mass) | Basic compound (parts by mass) | Solvent (parts by mass) |
|---|---|---|---|---|
| SL resist for ArF | ArF monolayer resist polymer 1 (100) | PAG 1 (6.6) | Amine 1 (0.8) | PGMEA (2,500) |

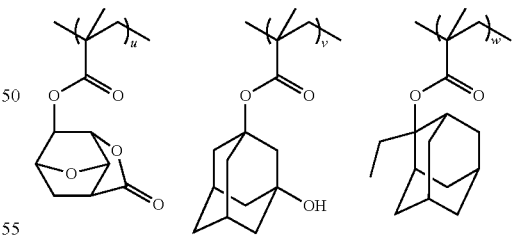

ArF monolayer resit polymer 1
(u = 0.40, v = 0.30, w = 0.30 Mw 7,800)

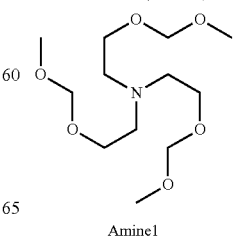

Amine1

TABLE 4-continued

| No. | Polymer (parts by mass) | Acid generator (parts by mass) | Basic compound (parts by mass) | Solvent (parts by mass) |
|---|---|---|---|---|

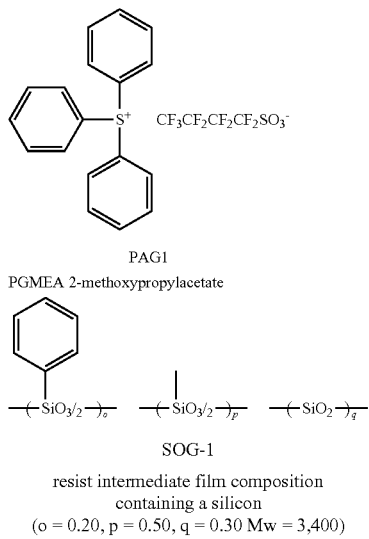

PAG1

PGMEA 2-methoxypropylacetate

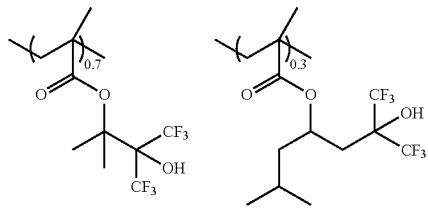

SOG-1 resist intermediate film composition
containing a silicon
(o = 0.20, p = 0.50, q = 0.30 Mw = 3,400)

A resin having a composition shown in Table 5, was dissolved into a solvent, followed by filtration by a filter made of fluororesin of a 0.1 size, to prepare the immersion resist top coat (TC-1).

TABLE 5

| | Polymer (parts by mass) | Organic solvent (parts by mass) |
|---|---|---|
| TC-1 | Top coat polymer (100) | diisoamyl ether (2700) 2-methyl-1-butanol (270) |

Top coat polymer: the following structural formula

Top coat polymer
Weight-average molecular weight (Mw) = 8,800
Molecular-weight distribution (Mw/Mn) = 1.69

Then, each of the samples thus obtained was exposed with changing the exposure dose by using an ArF immersion exposure instrument NSR-S610C (manufactured by Nikon Corporation; NA 1.30, σ 0.98/0.65, 35-degree dipole s-polarized illumination, 6% half tone phase-shift mask), baked at 100° C. for 60 seconds (PEB), and then developed by an aqueous solution of 2.38% by mass of tetramethyl ammonium hydroxide (TMAH) for 30 seconds to obtain a positive type line-and-space pattern with the resist line width ranging from 50 nm to 30 nm and with 100 nm pitch.

Then, by using an etching equipment Telius (manufactured by Tokyo Electron Ltd.), the silicon-containing intermediate film was processed by dry etching using the resist pattern as a mask; thereafter, the underlayer film was processed by using the silicon-containing intermediate film as a mask, and then the $SiO_2$ film was processed by using the underlayer film as a mask. The results are shown in Table 6.

The etching was done under the conditions shown below.

Transfer Condition of a Resist Pattern to an SOG Film

Chamber pressure: 10.0 Pa
RF power: 1,500 W
$CF_4$ gas flow rate: 15 sccm
$O_2$ gas flow rate: 75 sccm
Treating time: 15 sec Transfer Condition of the SOG Film to an Underlayer Film
Chamber pressure: 2.0 Pa
RF power: 500 W
Ar gas flow rate: 75 sccm
$O_2$ gas flow rate: 45 sccm
Treating time: 120 sec Transfer Condition of the Underlayer Film to an $SiO_2$ Film
Chamber pressure: 2.0 Pa
RF power: 2,200 W
$C_5F_{12}$ gas flow rate: 20 sccm
$C_2F_6$ gas flow rate: 10 sccm
Ar gas flow rate: 300 sccm
$O_2$ gas flow rate: 60 sccm
Treating time: 90 sec Cross section of the pattern was observed by an electron microscope (S-4700, manufactured by Hitachi Ltd.) and the forms were compared. The results are summarized in Table 6.

TABLE 6

| | Underlayer film | Upperlayer resist film | Pattern profile after development | Profile after etching for transfer to intermediate film | Profile after etching for transfer to underlayer film | Profile after etching for transfer to substrate | Mimimum-pattern size without causing the pattern deformation after the etching for transfer to the substrate |
|---|---|---|---|---|---|---|---|
| Example 1 | UDL-1 | SL resist for ArF | Perpendicular | Perpendicular | Perpendicular | Perpendicular | 35 nm |
| Example 2 | UDL-2 | SL resist for ArF | Perpendicular | Perpendicular | Perpendicular | Perpendicular | 34 nm |
| Example 3 | UDL-3 | SL resist for ArF | Perpendicular | Perpendicular | Perpendicular | Perpendicular | 33 nm |
| Example 4 | UDL-4 | SL resist for ArF | Perpendicular | Perpendicular | Perpendicular | Perpendicular | 33 nm |

TABLE 6-continued

|  | Underlayer film | Upperlayer resist film | Pattern profile after development | Profile after etching for transfer to intermediate film | Profile after etching for transfer to underlayer film | Profile after etching for transfer to substrate | Mimimum-pattern size without causing the pattern deformation after the etching for transfer to the substrate |
|---|---|---|---|---|---|---|---|
| Example 5 | UDL-5 | SL resist for ArF | Perpendicular | Perpendicular | Perpendicular | Perpendicular | 34 nm |
| Example 6 | UDL-6 | SL resist for ArF | Perpendicular | Perpendicular | Perpendicular | Perpendicular | 34 nm |
| Example 7 | UDL-7 | SL resist for ArF | Perpendicular | Perpendicular | Perpendicular | Perpendicular | 31 nm |
| Example 8 | UDL-8 | SL resist for ArF | Perpendicular | Perpendicular | Perpendicular | Perpendicular | 32 nm |
| Example 9 | UDL-9 | SL resist for ArF | Perpendicular | Perpendicular | Perpendicular | Perpendicular | 34 nm |
| Example 10 | UDL-10 | SL resist for ArF | Perpendicular | Perpendicular | Perpendicular | Perpendicular | 31 nm |
| Example 11 | UDL-11 | SL resist for ArF | Perpendicular | Perpendicular | Perpendicular | Perpendicular | 33 nm |
| Example 12 | UDL-12 | SL resist for ArF | Perpendicular | Perpendicular | Perpendicular | Perpendicular | 33 nm |
| Comparative Example 1 | UDL-13 | SL resist for ArF | Perpendicular | Perpendicular | Perpendicular | Perpendicular | 40 nm |
| Comparative Example 2 | UDL-14 | SL resist for ArF | Perpendicular | Perpendicular | Perpendicular | Perpendicular | 39 nm |
| Comparative Example 3 | UDL-15 | SL resist for ArF | Perpendicular | Perpendicular | Perpendicular | Perpendicular | 40 nm |

As can be seen in Table 3, the underlayer film of the present invention has the refractive index qualified as the underlayer film of an actual use in the trilayer resist for an immersion lithography.

In addition, as shown in Table 6, the resist pattern profile after development, the profile after etching by oxygen, and the profile of the underlayer film after etching of the substrate were excellent. A pattern size after substrate transference changed in accordance with the resist line width formed by the exposure. As a result, pattern wiggling was formed at line width of about 40 nm in a composition whose hardness was about 0.40 GPa (Comparative Examples 1 to 3). On the other hand, it was found that wiggling was not formed until the pattern size reached 35 nm or lower when the underlayer film having hardness of 0.50 GPa or more was used (Examples 1 to 12).

The present invention is not limited to the above-described embodiment. The above-described embodiments are mere examples, and those having the substantially same structure as that described in the appended claims and providing the similar action and effects are included in the scope of the present invention.

What is claimed is:
1. A resist underlayer film composition, wherein the composition contains a polymer obtained by condensation of:
(a) at least one compound represented by the following general formula (1-1) and
   at least one compound or equivalent body thereof represented by the following general formula (2); or
(b) at least one compound represented by the following general formula (1-1),
   at least one compound represented by the following general formula (1-2), and
   at least one compound or equivalent body thereof represented by the following general formula (2):

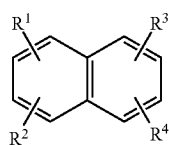

(1-1)

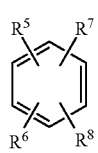

(1-2)

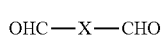

(2)

wherein $R^1$ to $R^8$ independently represent any of a hydrogen atom, a halogen atom, a hydroxyl group, an isocyanato group, a glycidyloxy group, a carboxyl group, an amino group, an alkoxyl group having 1 to 30 carbon atoms, an alkoxy carbonyl group having 1 to 30 carbon atoms, and an alkanoyloxy group having 1 to 30 carbon atoms, or an optionally-substituted saturated or unsaturated organic group having 1 to 30 carbon atoms, wherein two substituent groups arbitrarily selected from each of $R^1$ to $R^4$ or $R^5$ to $R^8$ may be bonded to form a cyclic substituent group within a molecule, and wherein X represents a single bond or a saturated or a unsaturated organic group having 1 to 30 carbon atoms.

2. The resist underlayer film composition according to claim 1, wherein the composition contains the polymer obtained by condensation of
(a) at least one compound represented by the general formula(1-1),
  at least one compound or equivalent body thereof represented by the following general formula (2), and
  at least one compound or equivalent body thereof represented by the following general formula (3); or
(b) at least one compound represented by the general formula (1-1), and
  at least one compound represented by the general formula (1-2),
  at least one compound or equivalent body thereof represented by the general formula (2), and
  at least one compound or equivalent body thereof represented by the following general formula (3):

Y—CHO (3)

wherein Y represents a hydrogen atom or an optionally-substituted monovalent organic group having 1 to 30 carbon atoms.

3. The resist underlayer film composition according to claim 2, wherein the resist underlayer film composition further contains any one or more of a crosslinking agent, an acid generator, and an organic solvent.

4. The resist underlayer film composition according to claim 2, wherein the polymer is represented by the following general formula (4-1) or (4-2):

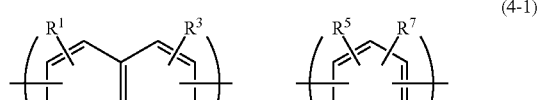

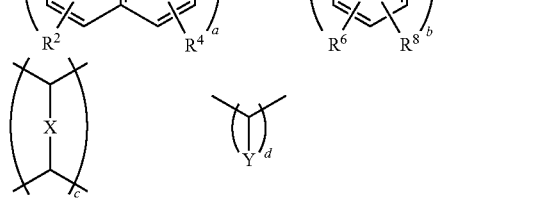

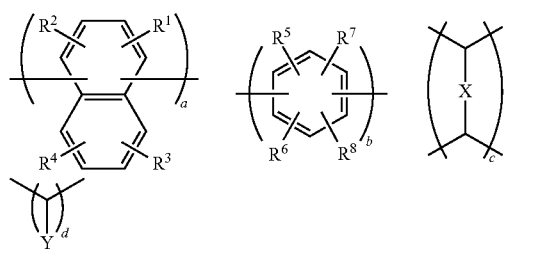

wherein $R^1$ to $R^8$, X, and Y represent the same meanings as before, a, b, c, and d represent the ratio of each unit to the totality of repeating units with satisfying the relationships of $0<c+d<a+b<1$ and $a+b+c+d=1$.

5. The resist underlayer film composition according to claim 4, wherein the resist underlayer film composition further contains any one or more of a crosslinking agent, an acid generator, and an organic solvent.

6. A patterning process on a body to be processed, wherein, at least, a resist underlayer film is formed on a body to be processed by using the resist underlayer film composition according to claim 5, a resist intermediate film is formed on the resist underlayer film by using a resist intermediate film composition containing a silicon atom, a resist upper layer film is formed on the resist intermediate film by using a resist upper layer film composition of a photoresist composition, a circuit pattern is formed in the resist upper layer film, the resist intermediate film is etched by using the resist upper layer film formed with the pattern as a mask, the resist underlayer film is etched by using the resist intermediate film formed with the pattern as a mask, and further, the body to be processed is etched by using the resist underlayer film formed with the pattern as a mask, whereby a pattern is formed on the body to be processed.

7. A patterning process on a body to be processed, wherein, at least, a resist underlayer film is formed on a body to be processed by using the resist underlayer film composition according to claim 5, a resist intermediate film is formed on the resist underlayer film by using a resist intermediate film composition containing a silicon atom, an organic antireflective film (BARC) is formed on the resist intermediate film, a resist upper layer film is formed on the BARC by using a resist upper layer film composition of a photoresist composition thereby forming a four-layer resist film, a circuit pattern is formed in the resist upper layer film, the BARC and the resist intermediate film are etched by using the resist upperlayer film formed with the pattern as a mask, the resist underlayer film is etched by using the resist intermediate film formed with the pattern as a mask, and further, the body to be processed is etched by using the resist underlayer film formed with the pattern as a mask, whereby a pattern is formed on the body to be processed.

8. A patterning process on a body to be processed, wherein, at least, a resist underlayer film is formed on a body to be processed by using the resist underlayer film composition according to claim 5, an intermediate film of an inorganic hard mask, selected from any of a silicon oxide film, a silicon nitride film, a silicon oxide nitride film, and an amorphous silicon film, is formed on the resist underlayer film, a resist upper layer film is formed on the intermediate film of the inorganic hard mask by using a resist upper layer film composition of a photoresist composition, a circuit pattern is formed in the resist upper layer film, the intermediate film of the inorganic hard mask is etched by using the resist upperlayer film formed with the pattern as a mask, the resist underlayer film is etched by using the intermediate film of the inorganic hard mask formed with the pattern as a mask, and further, the body to be processed is etched by using the resist underlayer film formed with the pattern as a mask, whereby a pattern is formed on the body to be processed.

9. A patterning process on a body to be processed, wherein, at least, a resist underlayer film is formed on a body to be processed by using the resist underlayer film composition according to claim 5, an intermediate film of an inorganic hard mask, selected from any of a silicon oxide film, a silicon nitride film, a silicon oxide nitride film, and an amorphous silicon film, is formed on the resist underlayer film, an organic antireflective film (BARC) is formed on the intermediate film of the inorganic hard mask, a resist upper layer film is formed on the BARC by using a resist upper layer film composition of a photoresist composition thereby forming a four-layer resist film, a circuit pattern is formed in the resist upper layer film, the BARC and the intermediate film of the inorganic hard mask are etched by using the resist upperlayer film formed with the pattern as a mask, the resist underlayer film is etched by using the intermediate film of the inorganic hard mask formed with the pattern as a mask, and further, the body to be processed is etched by using the resist underlayer film formed with the pattern as a mask, whereby a pattern is formed on the body to be processed.

10. The resist underlayer film composition according to claim 1, wherein the polymer is represented by the following general formula (4-1) or (4-2):

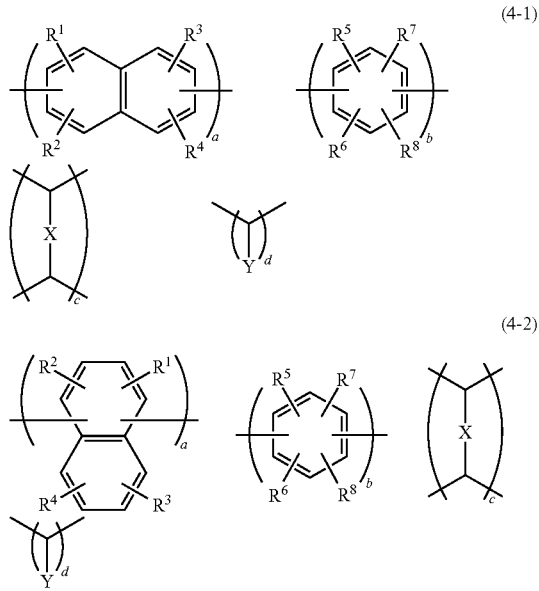

wherein $R^1$ to $R^8$, X, and Y represent the same meanings as before, a, b, c, and d represent the ratio of each unit to the totality of repeating units with satisfying the relationships of $0<c+d\leq a+b<1$ and $a+b+c+d=1$.

11. The resist underlayer film composition according to claim 10, wherein the resist underlayer film composition further contains any one or more of a crosslinking agent, an acid generator, and an organic solvent.

12. The resist underlayer film composition according to claim 1, wherein the resist underlayer film composition further contains any one or more of a crosslinking agent, an acid generator, and an organic solvent.

13. A patterning process on a body to be processed, wherein, at least, a resist underlayer film is formed on a body to be processed by using the resist underlayer film composition according to claim 1, a resist intermediate film is formed on the resist underlayer film by using a resist intermediate film composition containing a silicon atom, a resist upper layer film is formed on the resist intermediate film by using a resist upper layer film composition of a photoresist composition, a circuit pattern is formed in the resist upper layer film, the resist intermediate film is etched by using the resist upper layer film formed with the pattern as a mask, the resist underlayer film is etched by using the resist intermediate film formed with the pattern as a mask, and further, the body to be processed is etched by using the resist underlayer film formed with the pattern as a mask, whereby a pattern is formed on the body to be processed.

14. The patterning process according to claim 13, wherein the patterning process of the resist upper layer film is any of a photolithography method with the wavelength range between 10 nm or longer and 300 nm or shorter, a direct drawing method by an electron beam, and a nanoimprinting method, or a combination of them.

15. The patterning process according to claim 13, wherein a development method in the patterning process is an alkaline development or a development by an organic solvent.

16. The patterning process according to claim 13, wherein the body to be processed having, on a substrate of a semiconductor device, a film of any of a metal film, a metal carbide film, a metal oxide film, a metal nitride film, and a metal oxide nitride film is used.

17. The patterning process according to claim 16, wherein the metal is any of silicon, titanium, tungsten, hafnium, zirconium, chromium, germanium, copper, aluminum, and iron, or an alloy of these metals.

18. A patterning process on a body to be processed, wherein, at least, a resist underlayer film is formed on a body to be processed by using the resist underlayer film composition according to claim 1, a resist intermediate film is formed on the resist underlayer film by using a resist intermediate film composition containing a silicon atom, an organic antireflective film (BARC) is formed on the resist intermediate film, a resist upper layer film is formed on the BARC by using a resist upper layer film composition of a photoresist composition thereby forming a four-layer resist film, a circuit pattern is formed in the resist upper layer film, the BARC and the resist intermediate film are etched by using the resist upperlayer film formed with the pattern as a mask, the resist underlayer film is etched by using the resist intermediate film formed with the pattern as a mask, and further, the body to be processed is etched by using the resist underlayer film formed with the pattern as a mask, whereby a pattern is formed on the body to be processed.

19. A patterning process on a body to be processed, wherein, at least, a resist underlayer film is formed on a body to be processed by using the resist underlayer film composition according to claim 1, an intermediate film of an inorganic hard mask, selected from any of a silicon oxide film, a silicon nitride film, a silicon oxide nitride film, and an amorphous silicon film, is formed on the resist underlayer film, a resist upper layer film is formed on the intermediate film of the inorganic hard mask by using a resist upper layer film composition of a photoresist composition, a circuit pattern is formed in the resist upper layer film, the intermediate film of the inorganic hard mask is etched by using the resist upperlayer film formed with the pattern as a mask, the resist underlayer film is etched by using the intermediate film of the inorganic hard mask formed with the pattern as a mask, and further, the body to be processed is etched by using the resist underlayer film formed with the pattern as a mask, whereby a pattern is formed on the body to be processed.

20. The patterning process according to claim 19, wherein the intermediate film of the inorganic hard mask is formed by a CVD method or an ALD method.

21. A patterning process on a body to be processed, wherein, at least, a resist underlayer film is formed on a body to be processed by using the resist underlayer film composition according to claim 1, an intermediate film of an inorganic hard mask, selected from any of a silicon oxide film, a silicon nitride film, a silicon oxide nitride film, and an amorphous silicon film, is formed on the resist underlayer film, an organic antireflective film (BARC) is formed on the intermediate film of the inorganic hard mask, a resist upper layer film is formed on the BARC by using a resist upper layer film composition of a photoresist composition thereby forming a four-layer resist film, a circuit pattern is formed in the resist upper layer film, the BARC and the intermediate film of the inorganic hard mask are etched by using the resist upperlayer film formed with the pattern as a mask, the resist underlayer film is etched by using the intermediate film of the inorganic hard mask formed with the pattern as a mask, and further, the body to be processed is etched by using the resist underlayer film formed with the pattern as a mask, whereby a pattern is formed on the body to be processed.

22. The patterning process according to claim 21, wherein the intermediate film of the inorganic hard mask is formed by a CVD method or an ALD method.

23. The patterning process according to claim 22, wherein the patterning process of the resist upper layer film is any of a photolithography method with the wavelength range between 10 nm or longer and 300 nm or shorter, a direct drawing method by an electron beam, and a nanoimprinting method, or a combination of them.

24. The patterning process according to claim 23, wherein a development method in the patterning process is an alkaline development or a development by an organic solvent.

25. The patterning process according to claim 24, wherein the body to be processed having, on a substrate of a semiconductor device, a film of any of a metal film, a metal carbide film, a metal oxide film, a metal nitride film, and a metal oxide nitride film is used.

26. The patterning process according to claim 25, wherein the metal is any of silicon, titanium, tungsten, hafnium, zirconium, chromium, germanium, copper, aluminum, and iron, or an alloy of these metals.

* * * * *